US012578378B2

(12) United States Patent
Boianceanu et al.

(10) Patent No.: US 12,578,378 B2
(45) Date of Patent: Mar. 17, 2026

(54) CIRCUITS AND SYSTEMS FOR MONITORING DEGRADATION OF ONE OR MORE INTERFACE CHANNELS OF A SEMICONDUCTOR DEVICE USING A DEGRADATION MONITORING CIRCUIT THAT INCLUDES AN ELECTRICAL SENSOR

(71) Applicant: Infineon Technologies AG, Neubiberg (DE)

(72) Inventors: Cristian Mihai Boianceanu, Bucharest (RO); Ciprian-Ionut Florea, Rosu (RO)

(73) Assignee: Infineon Technologies AG, Neubiberg (DE)

( * ) Notice: Subject to any disclaimer, the term of this patent is extended or adjusted under 35 U.S.C. 154(b) by 115 days.

(21) Appl. No.: 18/402,140

(22) Filed: Jan. 2, 2024

(65) Prior Publication Data

US 2025/0216439 A1 Jul. 3, 2025

(51) Int. Cl.
*G01R 31/26* (2020.01)

(52) U.S. Cl.
CPC .............................. *G01R 31/2648* (2013.01)

(58) Field of Classification Search
CPC ............ G01R 31/2648; G01R 19/0084; G01R 31/2601; G01R 31/2621; G01R 31/2642; H10D 89/10; H10D 30/67; H10D 30/031; H10D 64/021; H10D 84/0126; H01L 2225/06596; H01L 25/0657; H01L 21/02532; H01L 2224/94; G06F 2212/1016; G06F 2119/04; G06F 11/368; G06F 11/3684; G06F 12/0646; G06F 18/20; G06F 18/217; G06F 2212/1032
See application file for complete search history.

(56) References Cited

U.S. PATENT DOCUMENTS 5,486,772 A * 1/1996 Hshieh ............... G01R 31/2621
                                              324/762.09
6,933,731 B2 * 8/2005 Reddy .................... H01L 22/34
                                              438/18
(Continued)

FOREIGN PATENT DOCUMENTS

DE      102008059853 A1     6/2010
DE      102011076651 A1    12/2011
(Continued)

*Primary Examiner* — Vinh P Nguyen
(74) *Attorney, Agent, or Firm* — Shumaker & Sieffert, P.A.

(57) ABSTRACT

A system includes a semiconductor device that includes a source terminal, a drain terminal, and an interface layer between the source terminal and the drain terminal, the interface layer including a plurality of interface channels. The system also includes a degradation monitoring circuit that includes an electrical sensor, wherein the degradation monitoring circuit is configured to: generate, using the electrical sensor, a sensor signal corresponding to one or more interface channels of the plurality of interface channels; determine, based on the sensor signal, whether a degradation of a material is present at the one or more interface channels of the plurality of interface channels; and output information indicating whether the degradation of the material is present at the one or more interface channels of the plurality of interface channels.

24 Claims, 7 Drawing Sheets

(56)        References Cited

U.S. PATENT DOCUMENTS

| 8,692,571 | B2 * | 4/2014 | Lai ..................... G01R 31/2642 |
| | | | 324/762.01 |
| 8,717,058 | B2 * | 5/2014 | Fukami .............. G01R 31/2642 |
| | | | 324/762.08 |
| 10,411,693 | B2 | 9/2019 | Boianceanu et al. |
| 2020/0366199 | A1 | 11/2020 | Ikeda |
| 2023/0194595 | A1 | 6/2023 | Djelassi-Tscheck et al. |

FOREIGN PATENT DOCUMENTS

| DE | 102014117512 | B4 | 7/2019 |
| DE | 112018002579 | T5 | 3/2020 |

* cited by examiner

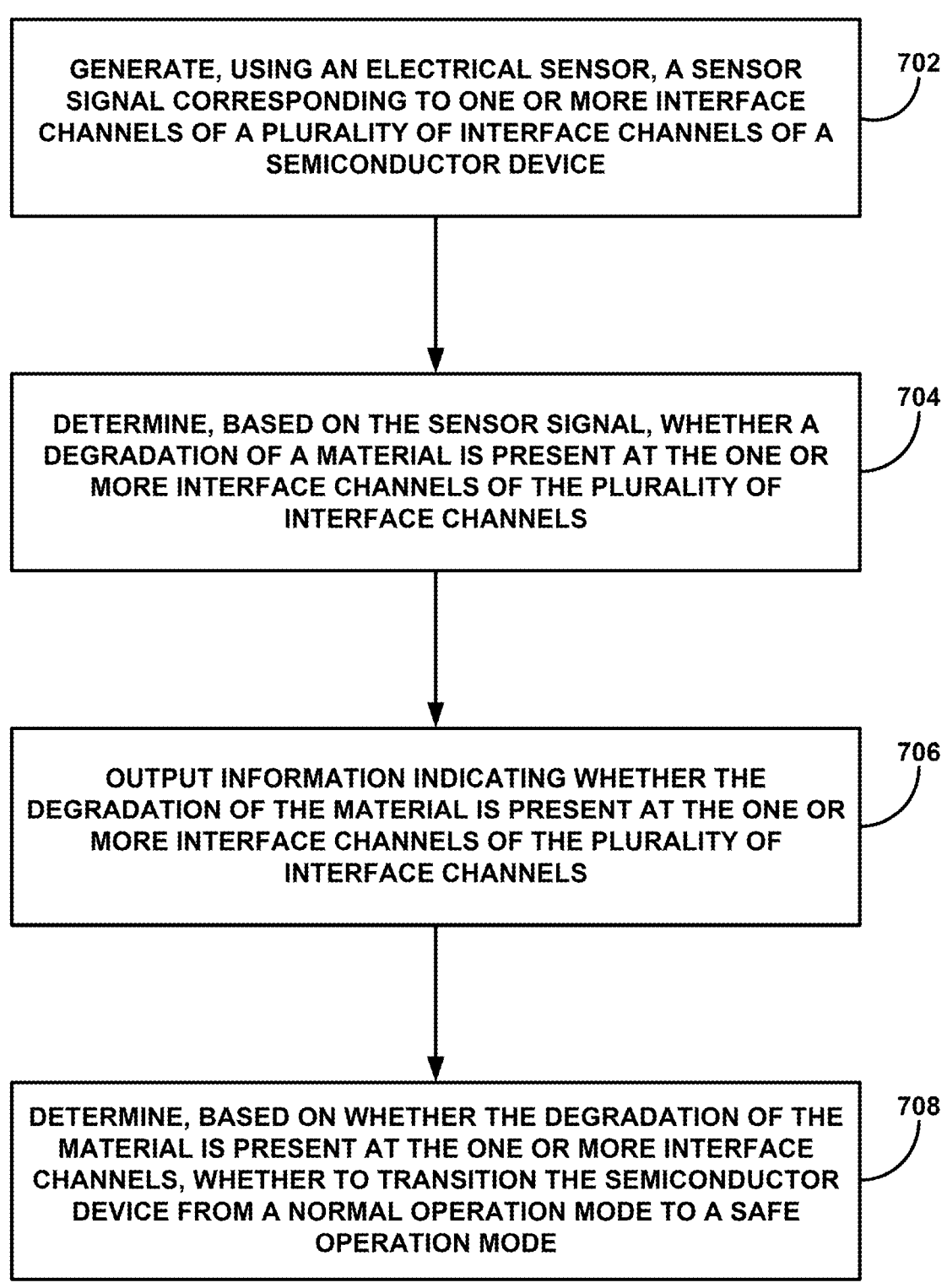

GENERATE, USING AN ELECTRICAL SENSOR, A SENSOR SIGNAL CORRESPONDING TO ONE OR MORE INTERFACE CHANNELS OF A PLURALITY OF INTERFACE CHANNELS OF A SEMICONDUCTOR DEVICE — 702

DETERMINE, BASED ON THE SENSOR SIGNAL, WHETHER A DEGRADATION OF A MATERIAL IS PRESENT AT THE ONE OR MORE INTERFACE CHANNELS OF THE PLURALITY OF INTERFACE CHANNELS — 704

OUTPUT INFORMATION INDICATING WHETHER THE DEGRADATION OF THE MATERIAL IS PRESENT AT THE ONE OR MORE INTERFACE CHANNELS OF THE PLURALITY OF INTERFACE CHANNELS — 706

DETERMINE, BASED ON WHETHER THE DEGRADATION OF THE MATERIAL IS PRESENT AT THE ONE OR MORE INTERFACE CHANNELS, WHETHER TO TRANSITION THE SEMICONDUCTOR DEVICE FROM A NORMAL OPERATION MODE TO A SAFE OPERATION MODE — 708

FIG. 7

CIRCUITS AND SYSTEMS FOR MONITORING DEGRADATION OF ONE OR MORE INTERFACE CHANNELS OF A SEMICONDUCTOR DEVICE USING A DEGRADATION MONITORING CIRCUIT THAT INCLUDES AN ELECTRICAL SENSOR

TECHNICAL FIELD

This disclosure relates to semiconductor devices such as power transistors.

BACKGROUND

A semiconductor device may include a source terminal, a drain terminal, and an interface layer between the source terminal and the gate terminal. The source terminal and the drain terminal may comprise one or more conductor materials. The interface layer may include one or more semiconductor materials that, when activated via a gate terminal, conducts electricity so that an electrical current flows from the source terminal to the gate terminal via the interface layer. In some cases, degradation may occur in the semiconductor device in a way that inhibits electrical current from flowing across the interface layer even when the semiconductor material is activated. This degradation may occur at portions of the interface layer connecting the semiconductor material of the interface layer with the source terminal or the drain terminal.

SUMMARY

In general, this disclosure is directed to a circuit for detecting degradation within a semiconductor device. For example, a system may include a degradation monitoring circuit comprising a sensor configured to generate a signal indicating degradation within the semiconductor device. The sensor may connect to a sensor current pathway within a semiconductor device such that an electrical current flowing through the sensor indicates one or more characteristics of the semiconductor device along the sensor current pathway. For example, the sensor may be configured to measure one or more electrical parameters such as any one or more of resistance, voltage, and current corresponding to the sensor current pathway. These electrical parameters may indicate whether degradation is present in a location along the sensor current pathway or proximate to the semiconductor current pathway.

For example, the source terminal and the drain terminal of the semiconductor device may include a conductor material such as copper and the interface layer may include a semiconductor material such as silicon. The interface layer may include a plurality of interface channels comprising a conductor material that connect the semiconductor material of the interface layer with the conductor material of the source terminal and the drain terminal. The signal generated by the sensor may indicate whether degradation is present at the interface channels of the interface layer, at a boundary between an interface channel and the drain terminal, or at a boundary between an interface channel and the source terminal. When an electrical parameter corresponding to an interface channel of the interface layer is higher than a threshold electrical parameter value, for example, this may indicate that degradation is present within the semiconductor device along the sensor current pathway, such as at a boundary between an interface channel and the drain terminal.

The techniques of this disclosure may provide one or more advantages. For example, based on a sensor of a degradation monitoring circuit indicating one or more characteristics of a semiconductor device, the degradation monitoring circuit may detect faults in the semiconductor device more effectively as compared with systems that do not use a sensor to detect characteristics of the semiconductor device. The sensor may be configured to perform a measurement each time that the semiconductor material is activated during a switching cycle and able to conduct electricity. This means that the degradation monitoring circuit may track degradation over a lifetime of the semiconductor device and cause remedial action as soon as degradation is present. In some examples, the system may cause the semiconductor device to enter a safe operation mode in response to detecting degradation and output a message indicating the detected degradation. Since the semiconductor device may be configured to operate at decreased efficiency even when some degradation is present, causing the semiconductor device to enter a safe operation mode in response to detecting degradation provides time to replace the semiconductor device before the semiconductor device completely fails.

In some examples, a system includes a semiconductor device comprising a source terminal, a drain terminal, and an interface layer between the source terminal and the drain terminal, the interface layer comprising a plurality of interface channels. The system also includes an integrated degradation monitoring circuit comprising an electrical sensor, wherein the degradation monitoring circuit is configured to: generate, using the electrical sensor, a sensor signal corresponding to one or more interface channels of the plurality of interface channels; determine, based on the sensor signal, whether a degradation of a material is present at the one or more interface channels of the plurality of interface channels; and output information indicating whether the degradation of the material is present at the one or more interface channels of the plurality of interface channels.

In some examples, a degradation monitoring circuit includes an electrical sensor, wherein the degradation monitoring circuit is configured to: generate, using the electrical sensor, a sensor signal corresponding to one or more interface channels of a plurality of interface channels of a semiconductor device. The semiconductor device comprises: a source terminal; a drain terminal; and an interface layer between the source terminal and the drain terminal, the interface layer comprising the plurality of interface channels. The degradation monitoring circuit is also configured to determine, based on the sensor signal, whether a degradation of a material is present at the one or more interface channels of the plurality of interface channels; and output information indicating whether the degradation of the material is present at the one or more interface channels of the plurality of interface channels.

In some examples, a method includes generating, by a degradation monitoring circuit using an electrical sensor, a sensor signal corresponding to one or more interface channels of a plurality of interface channels of a semiconductor device. The semiconductor device includes a source terminal, a drain terminal, and an interface layer between the source terminal and the drain terminal, the interface layer comprising the plurality of interface channels. The method also includes determining, by the degradation monitoring circuit based on the sensor signal, whether a degradation of a material is present at the one or more interface channels of the plurality of interface channels; and outputting, by the degradation monitoring circuit, information indicating whether the degradation of the material is present at the one or more interface channels of the plurality of interface channels.

The summary is intended to provide an overview of the subject matter described in this disclosure. It is not intended to provide an exclusive or exhaustive explanation of the systems, devices, and methods described in detail within the accompanying drawings and description below. Further details of one or more examples of this disclosure are set forth in the accompanying drawings and in the description below. Other features, objects, and advantages will be apparent from the description and drawings, and from the claims.

BRIEF DESCRIPTION OF THE DRAWINGS

FIG. 7 is a flow diagram illustrating an example operation for determining whether degradation is present within a semiconductor device, in accordance with one or more techniques of this disclosure.

DETAILED DESCRIPTION

Figure 1:
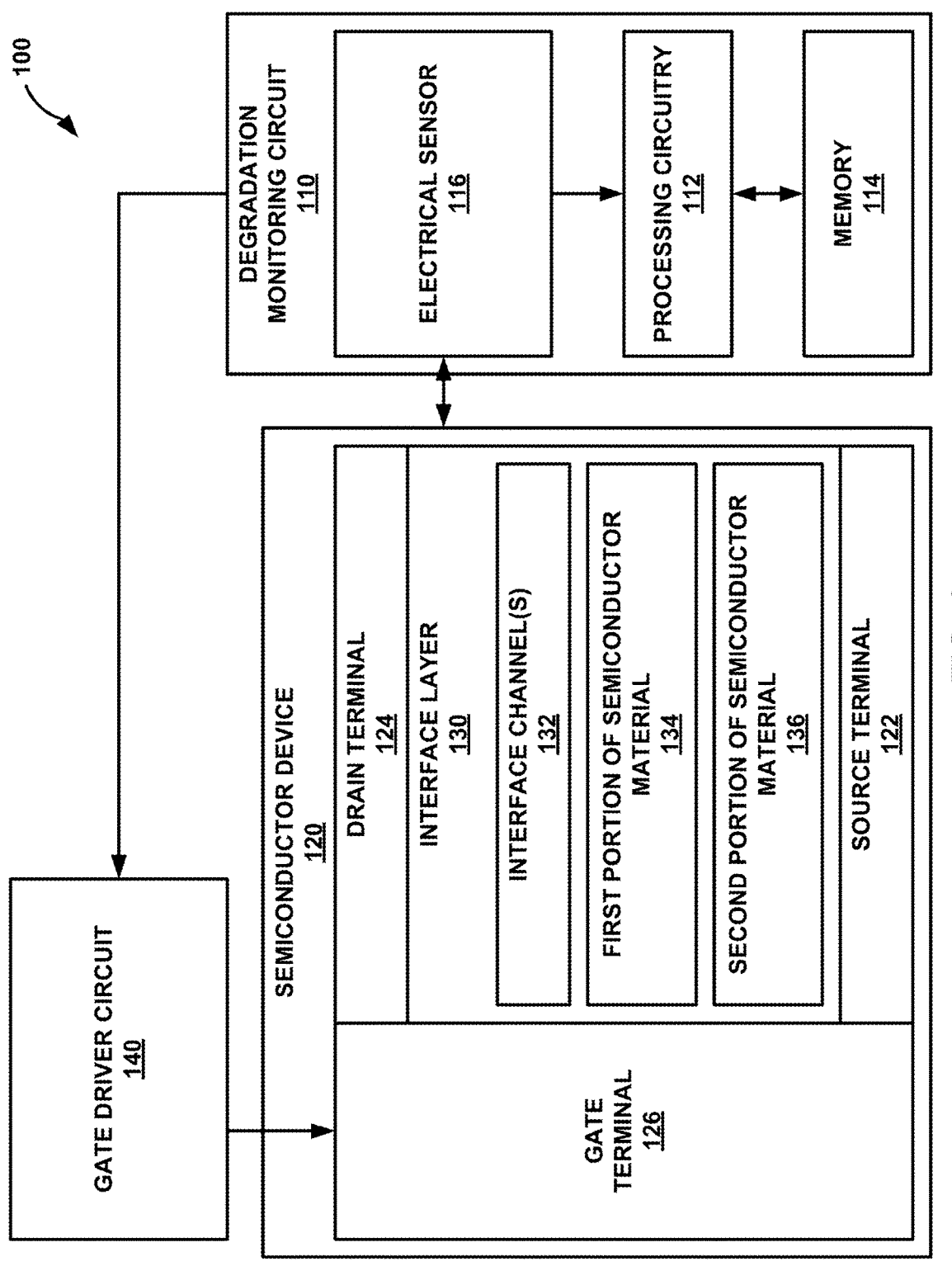
FIG. 1 is a block diagram illustrating a system for detecting degradation within a semiconductor device, in accordance with this disclosure.

FIG. 1 is a block diagram illustrating a system 100 for detecting degradation within a semiconductor device, in accordance with this disclosure. As seen in FIG. 1, system 100 includes degradation monitoring circuit 110 including processing circuitry 112, memory 114, and electrical sensor 116. System 100 also includes semiconductor device 120 including source terminal 122, drain terminal 124, gate terminal 126, and interface layer 130. Interface layer 130 includes interface channel(s) 132, first portion of semiconductor material 134, and second portion of semiconductor material 136. System 100 also includes gate driver circuit 140. Degradation monitoring circuit 110 may represent an integrated circuit configured to sense a signal indicating degradation and process the signal to detect degradation.

In a semiconductor device, degradation may cause one or more failure conditions that inhibit a performance of the semiconductor device. For example, degradation may involve delamination between components of a semiconductor device and/or cracks within materials of the semiconductor device. Degradation monitoring circuit 110 may be configured to detect degradation present in one or more components of semiconductor device 120. In some examples, degradation monitoring circuit 110 may monitor degradation over a period of time, such as a life of the semiconductor device 120. In response to degradation monitoring circuit 110 determining that degradation exceeds a threshold amount of degradation, degradation monitoring circuit 110 may output information indicating the degradation. Additionally, or alternatively, degradation monitoring circuit 110 may cause semiconductor device 120 to transition from a normal operation mode to a safe operation mode in response to degradation monitoring circuit 110 determining that degradation exceeds the threshold amount of degradation.

Degradation monitoring circuit 110 may include processing circuitry 112. Processing circuitry 112 may include, for example, one or more microprocessors, digital signal processors (DSPs), application specific integrated circuits (ASICs), field-programmable gate arrays (FPGAs), or equivalent discrete or integrated logic circuitry, or a combination of any of the foregoing devices or circuitry. Accordingly, processing circuitry 112 may include any suitable structure, whether in hardware, software, firmware, or any combination thereof, to perform the functions ascribed herein to degradation monitoring circuit 110.

Degradation monitoring circuit 110 may include memory 114 in communication with processing circuitry 112. In some examples, the memory 114 in communication with processing circuitry 112 stores computer-readable instructions that, when executed by the processing circuitry 112, cause degradation monitoring circuit 110 to perform various functions attributed to degradation monitoring circuit 110 herein. Memory 114 may include any volatile, non-volatile, magnetic, optical, or electrical media, such as a random-access memory (RAM), read-only memory (ROM), non-volatile RAM (NVRAM), electrically erasable programmable ROM (EEPROM), flash memory, or any other digital media capable of storing information.

Electrical sensor 116 may be configured to generate a sensor signal that indicates one or more characteristics of semiconductor device 120. In some examples, electrical sensor 116 may output an electrical signal via a sensor current pathway through semiconductor device 120 and receive the electrical signal via the sensor current pathway through semiconductor device 120. That is, electrical sensor 116 may be located on the sensor current pathway that extends through semiconductor device 120 such that electrical sensor 116 both outputs the electrical signal to semiconductor device 120 and receives the electrical signal from semiconductor device 120. Based on the electrical signal output to semiconductor device 120 and the electrical signal received from semiconductor device 120, electrical sensor 116 may generate the sensor signal that indicates one or more characteristics of semiconductor device 120. For example, the sensor signal may indicate one or more electrical parameters corresponding to the sensor current pathway. These one or more electrical parameters may indicate the one or more characteristics of semiconductor device 120.

Semiconductor device 120 may represent semiconductor transistor devices or other kinds of switches configured for power delivery. Semiconductor device 120 may, in some cases, include a power switch such as, but not limited to, any type of field-effect transistor (FET) including any one or combination of a metal-oxide-semiconductor field-effect transistor (MOSFET), a bipolar junction transistor (BJT), an insulated-gate bipolar transistor (IGBT), a junction field effect transistor (JFET), a high electron mobility transistor (HEMT), or other kinds of elements that use voltage or current for control. Additionally, semiconductor device 120 may include any one or combination of n-type transistors, p-type transistors, and other kinds of power transistors. In some examples, semiconductor device 120 includes vertical transistors, lateral transistors, and/or horizontal transistors. In some examples, semiconductor device 120 includes other analog devices such as diodes and/or thyristors. In some examples, semiconductor device 120 may operate as a switch and/or operate as an analog device.

In some examples, semiconductor device 120 includes three terminals: two load terminals and a control terminal. When semiconductor device 120 represents a MOSFET, the load terminals may include a source terminal (e.g., source terminal 122) and a drain terminal (e.g., drain terminal 124), and the control terminal includes at least one gate terminal (e.g., gate terminal 126). In examples where the two load terminals may include source terminal 122 and drain terminal 124, current may flow across semiconductor device 120 from the source terminal 122 to the drain terminal 124. In examples where the control terminal includes gate terminal 126, semiconductor device 120 may control a current flowing from source terminal 122 to the drain terminal 124 based on a control signal received by gate terminal 126. When semiconductor device 120 represents a BJT switch, the control terminal may represent a base terminal (not illustrated in FIG. 1).

Current may flow between the two load terminals of semiconductor device 120 based on the voltage at the respective control terminal. That is, current may flow from drain terminal 124 to source terminal 122 based on a voltage at gate terminal 126. Therefore, electrical current may flow across semiconductor device 120 from source terminal 122 to drain terminal 124 based on control signals delivered to gate terminal 126 of semiconductor device 120. In one example, if a voltage applied to the gate terminal 126 of semiconductor device 120 is greater than or equal to a voltage threshold, semiconductor device 120 may be activated, an electrical current to flow from source terminal 122 to drain terminal 124. Furthermore, semiconductor device 120 may be deactivated when the voltage applied to the gate terminal 126 of semiconductor device 120 is below the threshold voltage, thus preventing electrical current from flowing from source terminal 122 to drain terminal 124.

Semiconductor device 120 may include various material compounds, such as silicon, silicon carbide, gallium nitride, or any other combination of one or more semiconductor materials. In some examples, silicon carbide switches may experience lower switching power losses. Improvements in magnetics and faster switching, such as gallium nitride switches, may allow a power transistor to draw short bursts of current. These higher frequency devices may require control signals (e.g., voltage signals delivered to the control terminal of the power transistor) to be sent with more precise timing, as compared to lower-frequency devices.

Semiconductor device 120 may include an interface layer 130 between source terminal 122 and drain terminal 124. When semiconductor device 120 is activated, an electrical current may flow from source terminal 122 to drain terminal 124 across interface layer 130. When semiconductor device 120 is deactivated, Interface layer 130 may prevent an electrical current from flowing across semiconductor device 120 from source terminal 122 to drain terminal. The control signal received by gate terminal 126 may control whether semiconductor device 120 is activated such that interface layer 130 conducts electricity or whether semiconductor device 120 is deactivated such that interface layer 130 does not conduct electricity.

Source terminal 122 and drain terminal 124 may comprise one or more conductor materials such as copper, silver, aluminum, gold, graphite, or any combination thereof. Conductor materials may conduct electricity without being activated or otherwise stimulated by another signal. That is, conductor materials may have a high level of electrical conductivity, allowing an easy flow of electrical current. For example, copper may carry an electrical current freely without a control signal activating copper to conduct the electrical current.

Semiconductor materials may have a moderate conductivity such that electrical current is configured to flow through semiconductor materials. In some cases, electrical current might not flow through semiconductor materials as easily as electrical current flows through conductor materials. In some examples, electrical current flows through a semiconductor material only when a voltage greater than a voltage threshold is applied to the semiconductor material. This means a semiconductor material may be used in a semiconductor device such as a power transistor so that it is possible to control whether current flows across the power transistor based on voltage applied to the semiconductor material. Examples of semiconductor materials include silicon, gallium arsenide, gallium nitride, germanium, and silicon carbide.

In some examples, interface layer 130 of semiconductor device 120 may include interface channel(s) 132. Each interface channel of interface channel(s) 132 may include a conductor material. The conductor material of interface channel(s) 132 may include the same conductor material as a conductor material of source terminal 122 and/or drain terminal 124, but this is not required. In some cases, the conductor material of interface channel(s) 132 may be different than the conductor material of source terminal 122 and/or drain terminal 124. In any case, the conductor material if interface channel(s) 132 may be configured to conduct electricity that flows through semiconductor device 120 from source terminal 122 to drain terminal 124 via interface layer 130. For example, one or more of interface channel(s) 132 may represent an interface between source terminal 122 and semiconductor material 134, 136 and one or more of interface channel(s) 132 may represent an interface between semiconductor material 134, 136 and drain terminal 124.

Interface layer 130 may include first portion of semiconductor material 134 and second portion of semiconductor material 136. Interface layer 130 is not limited to including two portions of semiconductor material. In some examples, interface layer 130 includes more than two portions of semiconductor material. In some examples, first portion of semiconductor material 134 and second portion of semiconductor material 136 may extend through interface layer 130 substantially perpendicular to drain terminal 124 and source terminal 122. That is, interface layer 130 may extend along a space between drain terminal 124 and source terminal 122, where drain terminal 124 and source terminal 122 are parallel to each other.

Interface channel(s) 132 may connect first portion of semiconductor material 134 and second portion of semiconductor material 136 to source terminal 122 and/or drain terminal 124. In some examples, a set of interface channels of interface channel(s) 132 may connect first portion of semiconductor material 134 with source terminal 122. In some examples, a set of interface channels of interface channel(s) 132 may connect second portion of semiconductor material 136 with source terminal 122. In some examples, a set of interface channels of interface channel(s) 132 may connect first portion of semiconductor material 134 with drain terminal 124. In some examples, a set of interface channels of interface channel(s) 132 may connect second portion of semiconductor material 136 with drain terminal 124.

Degradation may cause semiconductor devices to fail. For example, when one or more materials crack, break, separate, or otherwise degrade in a way that hinders an ability of electrical current to flow through the semiconductor device, this may hinder an ability of the semiconductor device to function. As a semiconductor device performs a sequence of switching cycles, a temperature of the semiconductor device may increase while the semiconductor device is activated and decrease while the semiconductor device is activated. Since a semiconductor device may toggle between being activated and being deactivated throughout a sequence of switching cycles, this means that the temperature of the semiconductor device may fluctuate between a first temperature and a second temperature higher than the first temperature. These temperature fluctuations may cause degradation of one or more materials of the semiconductor device.

One type of degradation is delamination. In some cases, delamination occurs when a material separates to form a crack. Delamination may also occur when two materials that were previously in contact separate so that a crack forms at a boundary between the two materials. In semiconductor device 120, it may be important for electrical current to flow through certain materials and over boundaries between materials so that semiconductor device 120 can perform certain functions. When materials delaminate or otherwise degrade, this may negatively affect an ability of electrical current to flow through semiconductor device 120. Consequently, it may be beneficial for degradation monitoring unit 110 to monitor semiconductor device 120 for an extended period of time to detect degradation.

Effects of degradation may, in some examples, manifest in a semiconductor device when the semiconductor device has completed a certain number of switching cycles. For example, the semiconductor device may operate normally during a large portion of a working life of the semiconductor device. But during each switching cycle, heating fluctuations may cause materials of the semiconductor device to degrade. After a certain number of switching cycles, materials of the semiconductor device may give way. For example, delamination may occur within materials or at boundaries between materials when semiconductor device 120 has completed a certain number of switching cycles.

This may, for example, affect an ability of the semiconductor device to conduct electricity.

Degradation may occur, for example, at one or more interface channels of interface channel(s) 132. One example of degradation is where an interface channel of interface channel(s) 132 separates from the source terminal 122 or separates from the drain terminal 124. When an interface channel of interface channel(s) 132 separates from the drain terminal 124, for example, this may hinder an ability of electrical current to flow from the interface channel to the drain terminal 124. This means that even when the semiconductor device 120 is activated such that electrical current flows through first portion of semiconductor material 134 and second portion of semiconductor material 136, degradation at one or more interface channels may decrease an ability of current to flow through semiconductor device.

The sensor signal generated by electrical sensor 116 may indicate degradation along a sensor current pathway or proximate to the sensor current pathway corresponding to electrical sensor 116. For example, the sensor signal generated by electrical sensor 116 may indicate one or more electrical parameter values corresponding to the sensor current pathway. The one or more electric parameter values may include one or more resistance values, one or more voltage values, one or more current values, or any combination thereof. A change in one or more electrical parameter values indicated by the sensor signal may correspond to degradation forming along the sensor current pathway. For example, a resistance corresponding to the sensor current pathway may increase in response to degradation forming along the sensor current pathway. A voltage drop corresponding to the sensor current pathway may increase in response to degradation forming along the sensor current pathway. A magnitude of an electrical current flowing through the sensor current pathway may decrease in response to degradation forming along the sensor current pathway.

Degradation sensed by degradation monitoring circuit 110 is not limited to delamination between interface channel(s) 132 and source terminal 122 and delamination between interface channel(s) 132 and drain terminal 124. Degradation monitoring circuit 110 may be configured to sense degradation at any point along a sensor current pathway corresponding to electrical sensor 116. For example, delamination or other degradation may occur between interface channel(s) 132 and first portion of semiconductor material 134 or between interface channel(s) 132 and second portion of semiconductor material 136. Delamination or other degradation may additionally or alternatively occur within source terminal 122, within drain terminal 124, within interface channel(s) 132, within first portion of semiconductor material 134, or within second portion of semiconductor material 136. In any case, degradation monitoring circuit 110 may detect degradation along a sensor current pathway corresponding to electrical sensor 116 based on one or more parameters sensed by electrical sensor 116.

In some examples, one or more sensor current pathways corresponding to electrical sensor 116 may pass through interface layer 130 of semiconductor device 120. For example, a sensor current pathway may extend from electrical sensor 116 to first portion of semiconductor material 134, pass through first portion of semiconductor material 134 to a first interface channel of interface channel(s) 132, pass through the first interface channel to drain terminal 124, pass through drain terminal 124 to a second interface channel of interface channel(s) 132, and return to electrical sensor 116 via second portion of semiconductor material 136.

The sensor current pathway is not limited to passing through drain terminal 124. In some examples, a sensor current pathway of system 100 may extend from electrical sensor 116 to first portion of semiconductor material 134, pass through first portion of semiconductor material 134 to a third interface channel of interface channel(s) 132, pass through the third interface channel to source terminal 122, pass through source terminal 122 to a fourth interface channel of interface channel(s) 132, and return to electrical sensor 116 via second portion of semiconductor material 136. One or more other current pathways may exist through 130 that pass through interface channel(s) 132 and one of source terminal 122 and drain terminal 124 between passing through first portion of semiconductor material 134 and second portion of semiconductor material 136.

In some examples, system 100 may include more than one sensor current pathway corresponding to electrical sensor 116. That is, electrical sensor 116 may be configured to detect degradation along more than one sensor current pathway. When there exists more than one sensor current pathway corresponding to electrical sensor 116, this may allow degradation monitoring circuit 110 to detect whether degradation is present at each of a set of locations within semiconductor device. For example, when a first sensor current pathway passes through drain terminal 124 and a second sensor current pathway passes through source terminal 122, degradation monitoring circuit 110 may determine whether degradation is present at drain terminal 124 and/or interface channels connected to drain terminal 124 and determine whether degradation is present at source terminal 122 and/or interface channel connected to source terminal 122.

Electrical sensor 116 may generate an electrical signal and output the electrical signal to semiconductor devices 120. Electrical sensor 116 may output the electrical signal via a sensor current pathway through semiconductor device 120 and receive the electrical signal from semiconductor device 120 as the electrical signal travels through the sensor current pathway. Electrical sensor 116 may generate a sensor signal based on the electrical signal that electrical sensor 116 outputs via the sensor current pathway and receives via the sensor current pathway. Processing circuitry 112 of degradation monitoring circuit 110 may determine the one or more electrical parameter values based on the sensor signal. These one or more electrical parameter values may indicate the one or more parameter values may include resistance, voltage, current, other electrical parameters, or any combination thereof.

Processing circuitry 112 of degradation monitoring circuit 110 may determine, based on one or more parameter values determined by processing circuitry 112, whether a degradation of a material is present at one or more interface channels of interface channel(s) 132. For example, one or more interface channels of interface channel(s) 132 may be located along a sensor current pathway corresponding to electrical sensor 116. Degradation at one or more interface channels of interface channel(s) 132 located along a sensor current pathway corresponding to electrical sensor 116 may affect one or more parameter values determined based on the electrical signal output and received by electrical sensor 116. For example, degradation present at one or more interface channels of interface channel(s) 132 located along the sensor current pathway may cause an electrical parameter value detected by electrical sensor 116 to increase as compared with examples where degradation is not present at the one or more interface channels.

In some examples, degradation monitoring circuit 110 includes a comparator. The sensor signal generated by electrical sensor 116 may indicate an electrical parameter value corresponding to one or more interface channels of interface channel(s) 132 along a sensor current pathway corresponding to electrical sensor 116. Degradation monitoring circuit 110 is configured to compare, using the comparator, the electrical parameter value to a baseline electrical parameter value. Degradation monitoring circuit 110 may determine, based on comparing the electrical parameter value to the baseline electrical parameter value, whether degradation of a material is present at the one or more interface channels. In some examples, degradation at the one or more interface channels may cause the electrical parameter value sensed by electrical sensor 116 to increase as compared with the electrical parameter value sensed by electrical sensor 116 when degradation is not present at the one or more interface channels.

To determine whether degradation of a material is present at one or more interface channels along a sensor current pathway corresponding to electrical sensor 166, degradation monitoring circuit 110 is configured to determine that the degradation of the material is present at the one or more interface channels when an electrical parameter value sensed by electrical sensor 116 is more than a threshold parameter amount greater than a baseline electrical parameter value. Degradation monitoring circuit 110 is configured to determine that the degradation of the material is not present at the one or more interface channels when the electrical parameter value sensed by electrical sensor 116 is not more than the threshold parameter amount greater than the baseline electrical parameter value.

Processing circuitry 112 of degradation monitoring circuit 110 may be configured to output information indicating whether degradation of a material is present in response determining whether degradation is present based on one or more parameters indicated by the sensor signal generated by electrical sensor 116. In some examples, processing circuitry 112 may output information indicating that degradation is not present. In some examples, processing circuitry 112 may output information indicating that degradation is present. Processing circuitry 112 may output the information to indicate a location of degradation detected by degradation monitoring circuit 110. For example, the location may include one or more interface channels of interface channel (s) 132, one or more boundaries between interface channel (s) 132 and terminals 122, 124, or one or more other locations.

In some examples, degradation monitoring circuit 110 may cause semiconductor device 120 to transition from a normal operation mode to a safe operation mode in response to degradation monitoring circuit 110 determining that degradation exceeds the threshold amount of degradation. To cause semiconductor device 120 to transition from the normal operation mode to the safe operation mode, degradation monitoring circuit 110 may disconnect one or more interface channels of interface channel(s) 132 where degradation is present so that electrical current does not flow through the one or more interface channels from source terminal 122 to drain terminal 124. In other words, degradation monitoring circuit 110 may remove portions of semiconductor device 120 where degradation is present from operation so that the semiconductor device 120 is configured to continue to operate.

The degradation monitoring circuit 110 may monitor degradation of semiconductor device 120 over an extended period of time. In some examples, degradation monitoring circuit 110 is configured to monitor degradation of semiconductor device 120 throughout a working life of semiconductor device 120 so that degradation monitoring circuit 110 may output a message when degradation is detected. In some cases, it may be beneficial to replace semiconductor device 120 with another semiconductor device or repair semiconductor device 120 when degradation is detected. Consequently, by monitoring degradation of semiconductor device 120 over the extended period of time, degradation monitoring circuit 110 may detect degradation when degradation occurs and promptly output information indicating the degradation.

In some examples, semiconductor device 120 is configured to perform a plurality of switching cycles. Each switching cycle of the plurality of switching cycles including an activation phase where electrical current flows between source terminal 122 and drain terminal 124. Each switching cycle of the plurality of switching cycles may include a deactivation phase where source terminal 122 is disconnected from drain terminal 124. In some examples, a control signal received by gate terminal 126 may cause semiconductor device 120 to transition between activation phases and deactivation phases of the plurality of switching cycles. For example, a voltage of the control signal received by gate terminal 126 may determine whether electrical current is able to flow between source terminal 122 and drain terminal 124 across interface layer 130.

Electrical sensor 116 of degradation monitoring circuit 110 may be configured to generate, during the deactivation phase of each switching cycle of a plurality of switching cycles of semiconductor device, a parameter measurement of a plurality of parameter measurements. That is, each parameter measurement of the plurality of parameter measurements may indicate one or more parameter values measured during a deactivation phase of a respective switching cycle of the plurality of switching cycles. This means the processing circuitry 112 of degradation monitoring circuit 110 may be configured to determine, based on each parameter measurement of the plurality of parameter measurements, whether degradation of a material is present along the sensor current pathway (e.g., at one or more interface channels along the sensor current pathway) during a deactivation phase of a respective switching cycle.

Gate driver circuit 140 may be configured to deliver a control signal to gate terminal 126. In some examples, gate driver circuit 140 is configured to deliver the control signal to gate terminal 126 to cause semiconductor device 120 to perform a plurality of switching cycles. The control signal delivered by gate driver circuit 140 may, in some examples, control a duty cycle of semiconductor device 120 and/or one or more other aspects of an operation of semiconductor device 120. In some examples, a controller (not illustrated in FIG. 1) may control gate driver circuit 140 to output the control signal to gate terminal 126.

In some examples, gate terminal 126 may be configured to control which interface channels of interface channel(s) 132 conduct electrical current when semiconductor device 120 is turned on. In response to semiconductor device 120 operating in the normal operation mode, electrical current may flow through each of interface channel(s) 132 when semiconductor device 120 is turned on. In response to determining that degradation of a material is present at one or more interface channels of interface channel(s) 132, degradation monitoring circuit 110 may transition the semiconductor device 120 from the normal operation mode to the safe operation mode. In the safe operation mode, semiconductor device 120 may disconnect the one or more interface channels of interface channel(s) 132 so that electrical current does not flow through the one or more interface channels where degradation is present. In the safe operation mode, electrical current may flow through interface channels of interface channel(s) 132 separate from the one or more interface channels where degradation is present.

To disconnect the one or more interface channels of interface channel(s) 132 where degradation is present, gate terminal 126 may receive a control signal from gate driver circuit 140 that causes gate terminal 126 to disconnect the one or more interface channels. In some examples, gate terminal 126 may control whether electrical current flows through the one or more interface channels of interface channel(s) 132 where degradation is present independently form whether electrical current flows through interface channels of interface channel(s) 132 where degradation is not present. This may allow gate terminal 126 to disconnect the one or more interface channels in response to determining that degradation is present at the one or more interface channels. When the one or more interface channels are disconnected, the semiconductor device 120 may operate in the safe operation mode. When all of interface channel(s) 132 are connected such that all of interface channel(s) 132 conduct electricity when semiconductor device 120 is turned on, semiconductor device 120 may operate in the normal operation mode.

Figure 2:
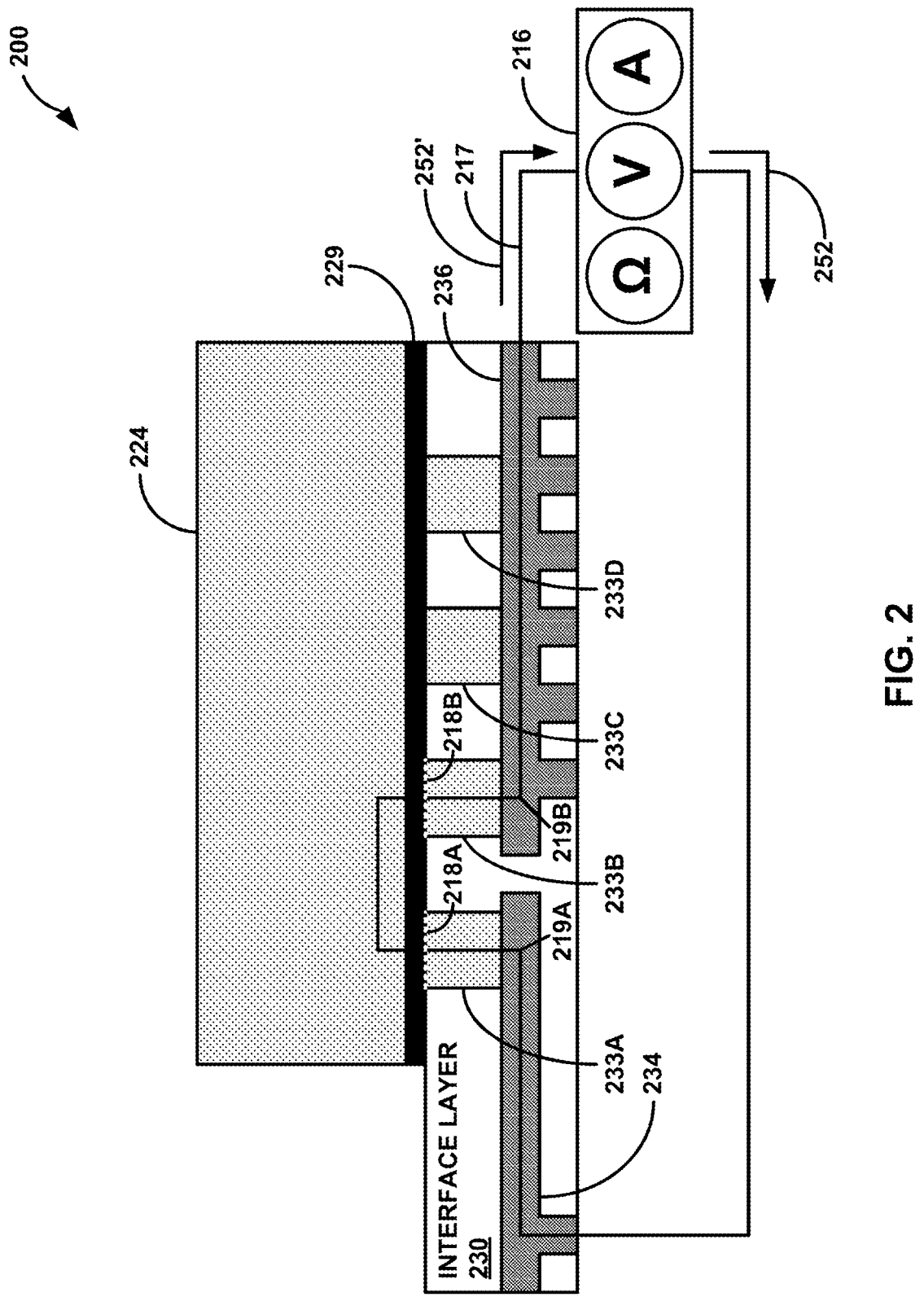
FIG. 2 is a conceptual diagram illustrating a system including an electrical sensor of a degradation monitoring circuit and an example sensor current pathway through a semiconductor device, in accordance with this disclosure.

FIG. 2 is a conceptual diagram illustrating a system 200 including an electrical sensor 216 of a degradation monitoring circuit and an example sensor current pathway 217 through a semiconductor device, in accordance with this disclosure. As seen in FIG. 2, system 200 may include electrical sensor 216, drain terminal 224, transition layer 229, and interface layer 230. Interface layer 230 includes interface channels 233A-233D (collectively, "interface channels 233"), first portion of semiconductor material 234, and second portion of semiconductor material 236.

Electrical sensor 216 may be an example of electrical sensor 116 of FIG. 1. Drain terminal 224 may be an example of drain terminal 124 of FIG. 1. Interface layer 230 may be an example of interface layer 130 of FIG. 1. Interface channels 233 may be examples of interface channel(s) 132 of FIG. 1. First portion of semiconductor material 234 may be an example of first portion of semiconductor material 134 of FIG. 1. Second portion of semiconductor material 236 may be an example of second portion of semiconductor material 136 of FIG. 1.

In some examples, drain terminal 224, transition layer 229, and interface layer 230 including interface channels 233, first portion of semiconductor material 234, and second portion of semiconductor material 236 may be part of a semiconductor device also including one or more components not illustrated in FIG. 2. For example, the semiconductor device of FIG. 2 may include a source terminal, a gate terminal, one or more interface channels, and one or more other components not illustrated in FIG. 2. That is, the semiconductor device of FIG. 2 may be an example of semiconductor device 120 of FIG. 1 but one or more components of semiconductor device 120 illustrated in FIG. 1 may not be illustrated in FIG. 2.

In the example of FIG. 2, an electrical current may flow from a source terminal to drain terminal 224 via interface layer 230 when the semiconductor device is activated. For example, when the semiconductor device is activated, electrical current may be configured to travel through first portion of semiconductor material 234 and second portion of semiconductor material 236 from a source terminal to drain terminal 224. When the semiconductor device is deactivated, electrical current might not flow from the source terminal to drain terminal 224 via interface layer 230. In some examples, a control signal received by a gate terminal of the semiconductor device may control whether the semiconductor device is activated or deactivated.

Electrical sensor 216 may be configured to generate a sensor signal that indicates degradation at one or more locations along sensor current pathway 217. As seen in FIG. 2, sensor current pathway 217 extends from electrical sensor 216 to first portion of semiconductor material 234. Sensor current pathway 217 extends through first portion of semiconductor material 234 to interface channel 233A and extends through interface channel 233A to drain terminal 224 via boundary 218A. Interface channel 233A may, in some examples, comprise a conductor material and first portion of semiconductor material 234 may, in some examples comprise a semiconductor material that is different than the conductor material of interface channel 233A.

The sensor signal generated by electrical sensor 216 may, in some examples, indicate one or more electrical parameters corresponding to sensor current pathway 217. For example, the one or more electrical parameters may include one or more resistance values ($\Omega$), one or more voltage values (V), one or more current values (A), or any combination thereof. Electrical sensor 216 may generate the sensor signal to indicate the one or more electrical parameters over time. For example, the sensor signal may indicate a resistance corresponding to the sensor current pathway 217 over time, a voltage drop corresponding to the sensor current pathway 217 over time, a magnitude of an electrical current flowing through the sensor current pathway 217 over time, or any combination thereof.

The one or more electrical parameter values measured by electrical sensor 216 over time may indicate whether degradation is present along sensor current pathway 217. For example, an increase in resistance corresponding to sensor current pathway 217 may indicate that degradation is present along sensor current pathway 217. An increase in a voltage drop along one or more portions of sensor current pathway 217 may indicate that degradation is present along sensor current pathway 217. A decrease in a magnitude of electrical current flowing through sensor current pathway 217 may indicate that degradation is present along sensor current pathway 217.

In some examples, drain terminal 224 includes a transition layer 229 at end of drain terminal 224. Transition layer 229 may include tungsten, a combination of tungsten and one or more other materials, or one or more materials other than tungsten. Sensor current pathway 217 may pass through transition layer 229 to a main body of drain terminal 224. Sensor current pathway 217 may pass through the main body of drain terminal 224, and pass again through transition layer 229 to interface channel 233B via boundary 218B. Sensor current pathway 217 may pass through interface channel 233B to second portion of semiconductor material 236. In some examples, interface channel 233B includes a conductor material and second portion of semiconductor material 236 may, in some examples comprise a semiconductor material that is different than the conductor material of interface channel 233B. Sensor current pathway 217 passes through second portion of semiconductor material 236 to electrical sensor 216. This means that a signal may pass through sensor current pathway 217 clockwise as sensor current pathway 217 is illustrated in FIG. 2.

The example of FIG. 2 is not limited to signals passing through sensor current pathway 217 clockwise. In some examples, a signal may pass through sensor current pathway 217 counterclockwise. For example, the signal may travel from electrical sensor 216 through second portion of semiconductor material 236, pass through interface channel 233B to drain terminal 224 via boundary 218B and transition layer 229, pass through a main body of drain terminal 224 to interface channel 233A via transition layer 229 and boundary 218A, and pass through interface channel 233A and first portion of semiconductor material 234 to electrical sensor 216.

Within interface layer 230, there may be a space between first portion of semiconductor material 234 and second portion of semiconductor material 236. Since there is a space between first portion of semiconductor material 234 and second portion of semiconductor material 236, this means that sensor current pathway 217 may travel through interface channel 233A, drain terminal 224, and interface channel 233B between first portion of semiconductor material 234 and second portion of semiconductor material 236. This means that the space between first portion of semiconductor material 234 and second portion of semiconductor material

236 may cause the sensor current pathway 217 to include one or more locations where degradation is likely to occur, such as boundary 218A between interface channel 233A and drain terminal 224 and boundary 218B between interface channel 233B and drain terminal 224.

Electrical sensor 216 may be configured to generate an electrical signal 252 for output through sensor current pathway 217 and electrical sensor 216 may receive the electrical signal 252' completing the sensor current pathway 217. The electrical signal 252 output by electrical sensor 216 and the electrical signal 252' received by electrical sensor 216 may indicate one or more characteristics of the sensor current pathway 217. A degradation monitoring circuit including electrical sensor 216 may calculate one or more electrical parameters corresponding to sensor current pathway 217 based on the electrical signal 252 output by electrical sensor 216 and the electrical signal 252' received by electrical sensor 216. For example, the degradation monitoring circuit including electrical sensor 216 may determine one or more electrical parameter values corresponding to sensor current pathway 217, one or more voltage values corresponding to sensor current pathway 217, one or more current values corresponding to sensor current pathway 217, one or more other electrical parameter values corresponding to sensor current pathway 217, or any combination thereof.

Degradation along sensor current pathway 217 may affect one or more electrical parameters calculated by degradation monitoring circuit including electrical sensor 216. This is because when materials separate to form a gap, these the gap may make it more difficult for electrical current to complete sensor current pathway 217, thus affecting one or more electrical parameters associated with the electrical signal 252 output from electrical sensor 216 via sensor current pathway 217 and one or more electrical parameters of the electrical signal 252' received by electrical sensor 216 via sensor current pathway 217.

When a gap or a crack forms at boundary 218A between interface channel 233A and drain terminal 224, for example, this may cause an electrical parameter value corresponding to sensor current pathway 217 as sensed by electrical sensor 216 to change, indicating that degradation is present along sensor current pathway 217. Additionally, or alternatively, the electrical parameter value corresponding to sensor current pathway 217 as sensed by electrical sensor 216 may change when a gap or a crack forms at boundary 218B between interface channel 233B and drain terminal 224. For example, a resistance associated with sensor current pathway 217 may increase in response to degradation forming along sensor current pathway 217 at boundary 218A or boundary 218B. A voltage drop from point 219A to point 219B may increase in response to degradation forming along sensor current pathway 217 at boundary 218A or boundary 218B. An electrical current flowing through sensor current pathway 217 may decrease in response to degradation forming along sensor current pathway 217 at boundary 218A or boundary 218B.

Transition layer 229 may be configured to conduct electricity even when degradation occurs at boundary 218A and/or boundary 218B. In response to degradation occurs at boundary 218A and/or boundary 218B, electrical current may flow through sensor current pathway 217 between interface channel 233A and interface channel 233B via transition layer 229. But the resistance of sensor current pathway 217 is greater when degradation is present at boundary 218A and/or boundary 218B as compared with the resistance of sensor current pathway 217 when degradation is not present at boundary 218A and boundary 218B. This is the case even when transition layer 229 conducts electricity when degradation is present.

Degradation may be likely to occur at boundaries between materials and/or choke points at boundaries between components. For example, degradation may be likely to occur at boundary 218A between interface channel 233A and drain terminal 224, at boundary 218B between interface channel 233B and drain terminal 224, and at one or more other boundaries. This is because boundaries may represent choke points where wear is likely to occur as the semiconductor is used. In some examples, the semiconductor device may be configured so that sensor current pathway 217 passes through areas where degradation is likely to occur. For example, the semiconductor device may be configured so that a space between semiconductor material 234 and second portion of semiconductor material 236 exists between interface channel 233A and interface channel 233B. This may ensure that sensor current pathway 217 passes through interface channel 233A, drain terminal 224, and interface channel 233A including boundary 218A between interface channel 233A and drain terminal 224 and boundary 218B between interface channel 233B and drain terminal 224.

The degradation monitoring circuit including electrical sensor 216 is not limited to detecting degradation at boundary 218A and boundary 218B. The degradation monitoring circuit including electrical sensor 216 may detect degradation at any location along sensor current pathway 217. For example, degradation may occur within first portion of semiconductor material 234, within interface channel 233A, within drain terminal 224, within interface channel 233B, within second portion of semiconductor material 236, or any combination thereof. In some examples, degradation may occur at a boundary between first portion of semiconductor material 234 and interface channel 233A and/or a boundary between second portion of semiconductor material 236 and interface channel 233B.

The sensor current pathway 217 illustrated in FIG. 2 is not the only possible sensor current pathway corresponding to the degradation monitoring circuit including electrical sensor 216. In some examples, the electrical sensor 216 may be connected to one or more sensor current pathways in addition to or alternatively to sensor current pathway 217. For example, one or more sensor current pathways may exist through interface layer 230 and a source terminal (not illustrated in FIG. 2). One or more sensor current pathways may exist through interface layer 230 and other locations of the drain terminal 224 not illustrated in FIG. 2.

In some cases, system 200 may include one or more interface channels that are not illustrated as part of interface channels 233 of FIG. 2. For example, a semiconductor device may include interface channels 233 connected to drain terminal 224 via transition layer 229, one or more additional interface channels connected to drain terminal 224 via transition layer 229, and one or more interface channels connected to a source terminal not illustrated in FIG. 2.

Electrical sensor 216 may be configured to perform a sequence of degradation measurements to monitor degradation over a period of time. For example, electrical sensor 216 may be configured to perform a degradation measurement of the sequence of degradation measurements during each switching cycle of a sequence of switching cycles. In some examples, each switching cycle of the sequence of switching cycles may include an activation phase and a deactivation phase. Electrical sensor 216 may perform a degradation measurement during the deactivation phase of each switching cycle of the sequence of switching cycles.

In some examples, the degradation monitoring circuit including electrical sensor 216 may perform one or more actions in response to determining that degradation is present at one or more interface channels (e.g., at boundary 218A and/or boundary 218B). For example, the degradation monitoring circuit may output information indicating that the degradation of the material is present at boundary 218A and/or boundary 218B. Additionally, or alternatively, the degradation monitoring circuit may cause the semiconductor device to transition from a normal operation mode to a safe operation mode by disconnecting interface channel 233A and/or interface channel 223B so that electrical current does not flow from a source terminal to drain terminal 224 via interface channel 233A and/or interface channel 223B when the semiconductor device is turned on. That is, in response to detecting degradation at boundary 218A and/or boundary 218B, the semiconductor device may remove interface channel 233A and/or interface channel 223B from the operation of the semiconductor device while allowing the semiconductor device to continue to operate. For example, when the semiconductor device is operating according to the safe operation mode, electrical current may flow through one or more interface channels other than interface channel 233A and/or interface channel 223B when the semiconductor device is turned on.

Figure 3:
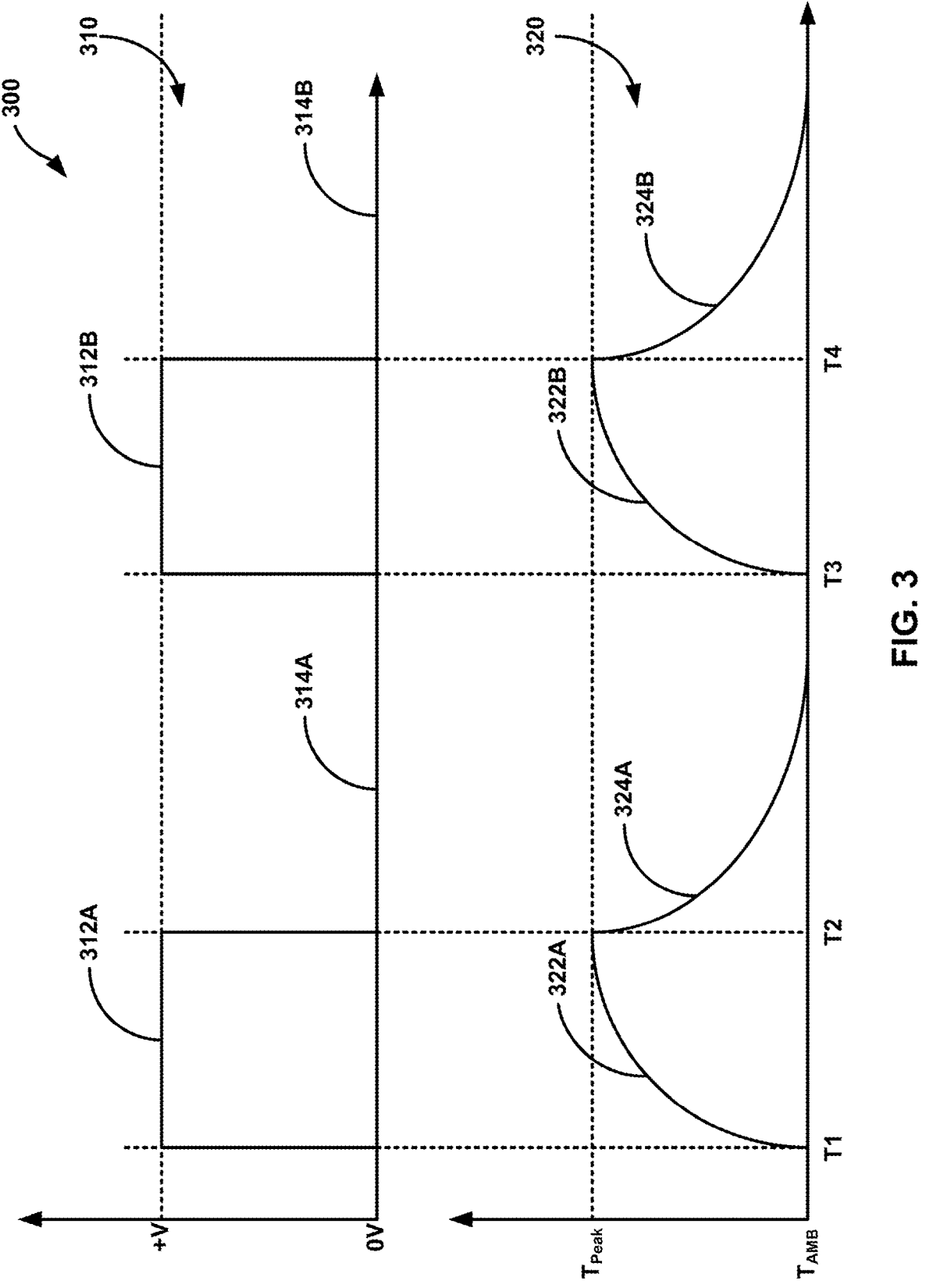
FIG. 3 is a plot diagram illustrating a graph of gate voltage and temperature of a semiconductor device as a function of time, in accordance with this disclosure.

FIG. 3 is a plot diagram illustrating a graph 300 of gate voltage and temperature of a semiconductor device as a function of time, in accordance with this disclosure. As seen in FIG. 3, graph 300 includes a first plot 310 of a gate voltage of a semiconductor device over a period of time. Graph 300 also includes a second plot 320 of one a temperature of one or more materials of the semiconductor device over the period of time.

First plot 310 may represent a gate voltage of a semiconductor device (e.g., semiconductor device 120 of FIG. 1) over a first switching cycle and a second switching cycle following the first switching cycle. The first switching cycle includes a first activation phase 312A extending from T1 to T2 and a first deactivation phase 314A extending from T2 to T3. During the first activation phase 312A, a gate voltage applied to gate terminal 126 of semiconductor device 120 is a high voltage (+V). During the first deactivation phase 314A, a gate voltage applied to gate terminal 126 of semiconductor device 120 is a low voltage (0V). Electrical current may flow through semiconductor device 120 from source terminal 122 to drain terminal 124 via interface layer 130 during the first activation phase 312A. Electrical current may not flow through semiconductor device 120 from source terminal 122 to drain terminal 124 via interface layer 130 during the first deactivation phase 314A.

During the second activation phase 312B extending from T3 to T4, a gate voltage applied to gate terminal 126 of semiconductor device 120 is a high voltage (+V). During the second deactivation phase 314B extending from T4, a gate voltage applied to gate terminal 126 of semiconductor device 120 is a low voltage (0V). Electrical current may flow through semiconductor device 120 from source terminal 122 to drain terminal 124 via interface layer 130 during the second activation phase 312B. Electrical current may not flow through semiconductor device 120 from source terminal 122 to drain terminal 124 via interface layer 130 during the second deactivation phase 314B.

As electrical current flows through semiconductor device 120, a temperature of one or more materials of the semiconductor device 120 may increase. For example, electrical current may flow through conductor materials of source terminal 122, drain terminal 123, and interface channel(s) 132 and flow through first portion of semiconductor material 134 and second portion of semiconductor material 136 during first activation phase 312A and second activation phase 312B. A temperature of one or more materials of the semiconductor device 120 may decrease during first deactivation phase 314B and second deactivation phase 314B when electrical current does not flow through semiconductor device 120.

Second plot 320 may represent a temperature of semiconductor device 120 over the first switching cycle and the second switching cycle. For example, first heat up phase 322A corresponds to first activation phase 312A, a first cool down phase 324A corresponds to first deactivation phase 314A, second heat up phase 322B corresponds to second activation phase 312B, and second cool down phase 324B corresponds to second deactivation phase 314B. As seen in FIG. 3, the temperature of semiconductor device 120 increases over time as electrical current flows through semiconductor device 120 during activation phases, and electrical current decreases over time as electrical current does not flow through semiconductor device 120 during deactivation phases.

Temperature fluctuations such as the fluctuations between an ambient temperature ($T_{AMB}$) and a peak temperature ($T_{Peak}$) illustrated in second plot 320 may contribute to degradation of semiconductor device 120. Over time, the temperature fluctuations may put stress on materials of semiconductor device 120. Stress over time may cause materials to delaminate. Delamination may, in some examples, be likely to occur at interface channel(s) 132 of semiconductor device 120 and at locations where interface channel(s) 132 connect to source terminal 122 and/or drain terminal 124. In some examples, degradation monitoring circuit 110 may perform a degradation measurement during the deactivation phase of each switching cycle. For example, degradation monitoring circuit 110 may perform a degradation measurement during first deactivation phase 314A and second deactivation phase 314B.

Figure 4:
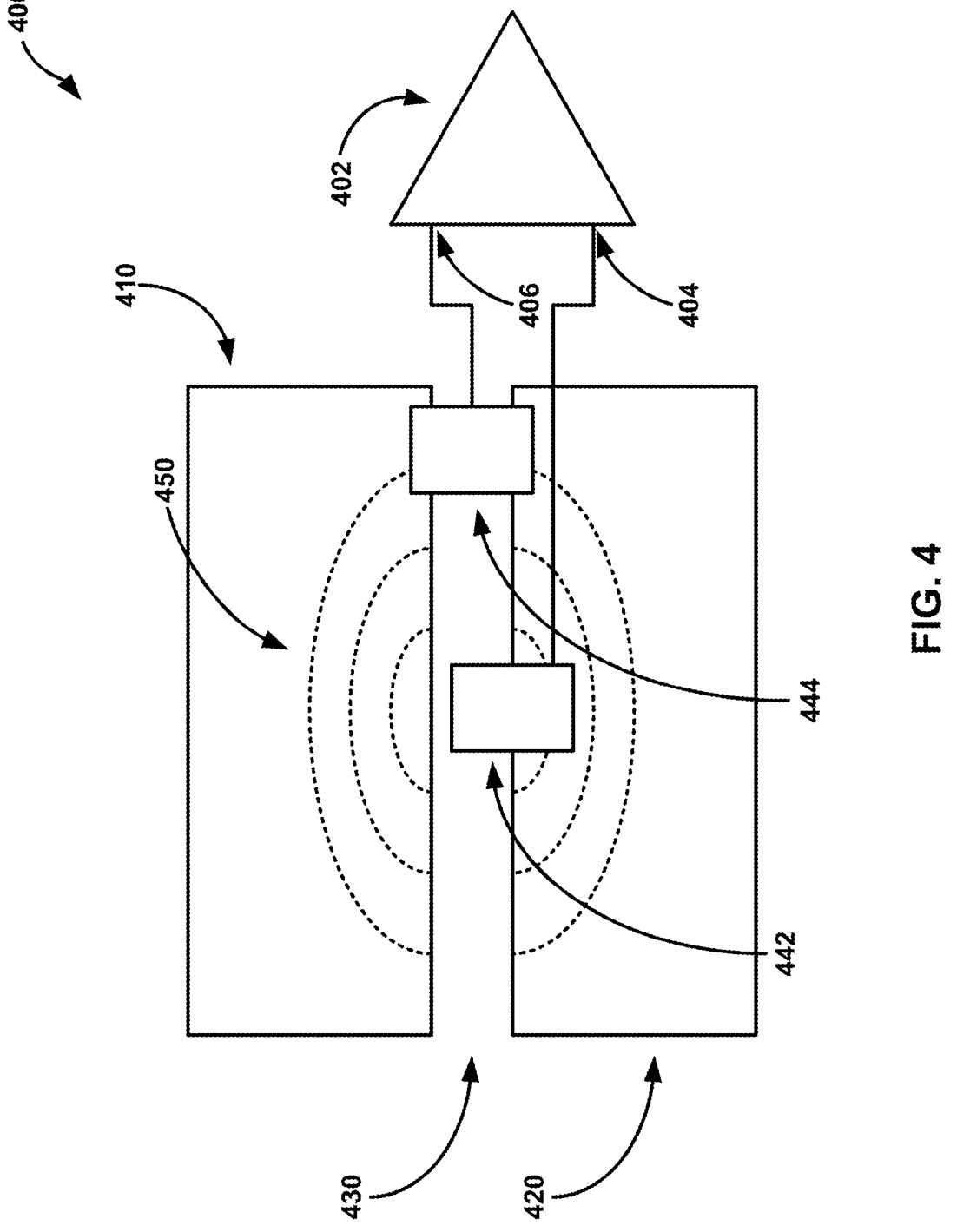
FIG. 4 is a conceptual diagram including a system for monitoring delamination by comparing electrical parameters of a region where delamination is likely to occur with electrical parameters of a region where delamination is not likely to occur, in accordance with this disclosure.

FIG. 4 is a conceptual diagram including a system 400 for monitoring delamination by comparing electrical parameters of a region where delamination is likely to occur with electrical parameters of a region where delamination is not likely to occur, in accordance with this disclosure. As seen in FIG. 4, system 400 includes a comparator 402 including a first input 404 and a second input 406, a first terminal 410, a second terminal 420, and an interface layer 430 between the first terminal 410 and the second terminal 420. System 400 includes a first sensor node 442 and a second sensor node 444. In some examples, first terminal 410 may represent one of a drain terminal and a source terminal of a semiconductor device and second terminal 420 represents the other of the source terminal and the drain terminal.

In some examples, first sensor node 442 may be located near a center of a hot region 450 where degradation is likely to occur, and second sensor node 444 may be located near an edge of hot region 450 where degradation is less likely to occur as compared with the higher likelihood of degradation at the center of the hot region 450. Comparator 402 may receive a first signal from first sensor node 442 via first input 404 and receive a second signal from second sensor node 444 via second input 406. Comparator 402 may output a signal that indicates a difference between the first signal and the second signal. When a difference between the first signal and the second signal is greater than a threshold difference value, this may indicate that degradation is present proximate to first sensor node 442 at the center of hot region 450. In response to determining that degradation is present proximate to first sensor node 442, system 400 may cause the semiconductor device to transition to a safe operation mode.

Figure 5:
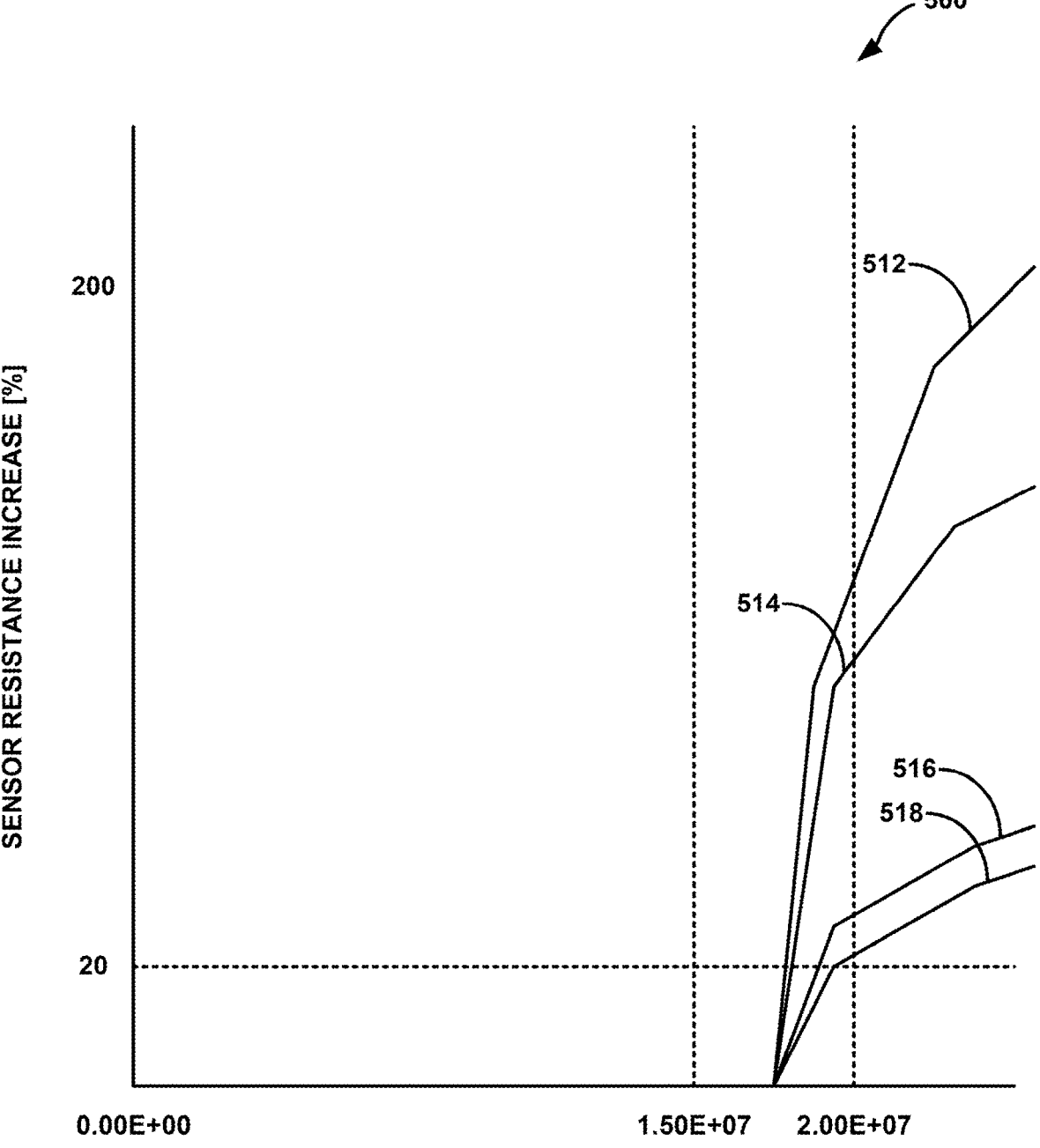
FIG. 5 is a plot diagram illustrating a graph indicating resistance of a set of sensor current pathways for a degradation monitoring circuit over a sequence of switching cycles of a semiconductor device, in accordance with this disclosure.

FIG. 5 is a plot diagram illustrating a graph 500 indicating resistance of a set of sensor current pathways for a degradation monitoring circuit over a sequence of switching cycles of a semiconductor device, in accordance with this disclosure. As seen in FIG. 5, graph 500 includes a first plot 512, a second plot 514, a third plot 516, and a fourth plot 518. In some examples, each plot of first plot 512, second plot 514, third plot 516, and fourth plot 518 may correspond to a sensor current pathway through a semiconductor device. As seen in FIG. 5, each of first plot 512, second plot 514, third plot 516, and fourth plot 518 begin increasing in resistance between 1.5E+07 switching cycles and 2.0E+07 switching cycles. In some examples, an increase in 20% for resistance may indicate that degradation is present in the semiconductor device.

In some examples, the semiconductor device may continue to function even when degradation is present that causes the resistance of first plot 512, second plot 514, third plot 516, and fourth plot 518 to increase. That is, degradation might not cause complete failure of a semiconductor device, but may cause the semiconductor device to operate at decreased efficiency. This means that it may be beneficial to cause the semiconductor device to operate in a safe operation mode when degradation is present to provide time to replace the semiconductor device before the semiconductor device completely fails. Causing the semiconductor device to operate in the safe operation mode may involve removing portions of the semiconductor device where degradation is present from operation. In other words, portions of the semiconductor device that do not include degradation may conduct electricity when the semiconductor device is turned on without electricity flowing through portions that include degradation.

Figure 6:
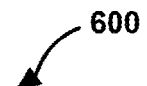
FIG. 6 is a plot diagram illustrating a graph indicating a variation of detection current when delamination occurs, in accordance with this disclosure.
Figure 6:
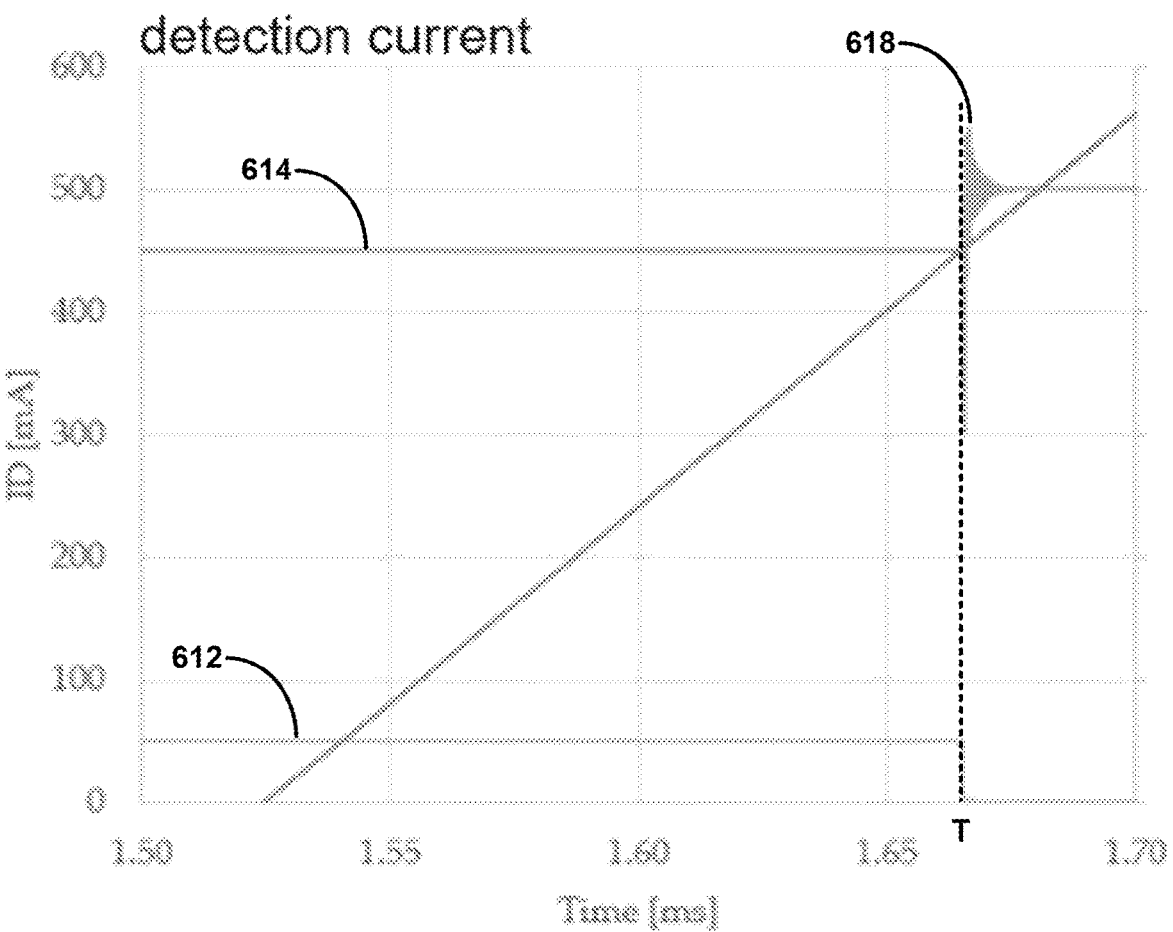

FIG. 6 is a plot diagram illustrating a graph 600 indicating a variation of detection current when delamination occurs, in accordance with this disclosure. As seen in FIG. 6, graph 600 includes a first current signal 612, a second current signal 614, and spikes 618 in the second current signal 614. In some examples, spikes 618 occur when delamination occurs at a sensor current pathway of a semiconductor device. An electrical sensor of a degradation monitoring circuit may detect degradation based on determining that first current signal 612 decreases and/or based on determining that second current signal 614 increases. For example, first current signal 612 decreases at time T and second current signal 614 increases at time T. Degradation may occur at time T, causing first current signal 612 to decrease and causing second current signal 614 to increase. This means that the a degradation monitoring circuit may identify degradation based on detecting the decrease in first current signal 612 and/or detecting the increase in second current signal 614. The degradation monitoring circuit is not limited to detecting degradation based on current. The degradation monitoring circuit may detect degradation based on current, voltage, resistance, one or more other electrical parameters, or any combination thereof.

FIG. 7 is a flow diagram illustrating an example operation for determining whether degradation is present within a semiconductor device, in accordance with one or more techniques of this disclosure. FIG. 7 is described with respect to system 100 of FIG. 1. However, the techniques of FIG. 7 may be performed by different components of system 100 or by additional or alternative systems.

Degradation monitoring circuit 110 may generate, using electrical sensor 116, a sensor signal corresponding to one or more interface channels of interface channel(s) 132 of semiconductor device 120 (702). Electrical sensor 116 may generate the sensor signal based on an electrical signal output via a sensor current pathway and the sensor signal received from the sensor current pathway when the electrical signal traverses the sensor current pathway. In some examples, the sensor signal may indicate one or more parameters such as resistance, voltage, current, or any combination thereof. The one or more parameters may indicate whether degradation is present along the sensor current pathway.

Processing circuitry 112 of degradation monitoring circuit 110 may determine, based on the sensor signal, whether a degradation of a material is present at the one or more interface channels of interface channel(s) 132 (704). For example, processing circuitry 112 may determine that degradation is present when a resistance indicated by the sensor signal exceeds a resistance threshold, when a voltage drop indicated by the sensor signal exceeds a voltage drop threshold, when a current magnitude associated with the sensor signal is lower than a current magnitude threshold, or any combination thereof. Processing circuitry 112 of degradation monitoring circuit 110 may output information indicating whether degradation of the material is present at the one or more interface channels of interface channel(s) 132 (706).

Processing circuitry 112 of degradation monitoring circuit 110 may determine, based on whether the degradation of the material is present at the one or more interface channels of interface channel(s) 132, whether to transition semiconductor device 120 from a normal operation mode to a safe operation mode (708). In the normal operation mode, electrical current may flow from the source terminal 122 of semiconductor device 120 to the drain terminal 124 of semiconductor device 120 via interface channel(s) 132 including interface channels where degradation is present. When degradation is not present in interface channel(s) 132, it may be beneficial for semiconductor device 120 to operate according to the normal operation mode so that semiconductor device 120 operates at maximum efficiency.

In response to detecting that degradation is present at the one or more interface channels of interface channel(s) 132, processing circuitry 112 of degradation monitoring circuit 110 may disconnect the one or more interface channels so that electrical current does not flow from source terminal 122 to drain terminal 124 via the one or more interface channels. In response to degradation monitoring circuit 110 disconnecting the one or more interface channels, degradation monitoring circuit 110 may operate according to the safe operation mode. In the safe operation mode, electrical current may flow from the source terminal 122 to drain terminal 124 via interface channels of interface channel(s) 132 that are separate from the one or more interface channels where degradation of the material is present. In the safe operation mode, the semiconductor device 120 may continue to operate even when degradation is present at the one or more interface channels. This may provide time to replace the semiconductor device 120 before the semiconductor device 120 completely fails.

The following numbered clauses may demonstrate one or more aspects of the disclosure.

Clause 1: A system includes a semiconductor device comprising: a source terminal; a drain terminal; and an interface layer between the source terminal and the drain terminal, the interface layer comprising a plurality of inter-face channels. The system also includes a degradation monitoring circuit comprising an electrical sensor, wherein the degradation monitoring circuit is configured to: generate, using the electrical sensor, a sensor signal corresponding to one or more interface channels of the plurality of interface channels; determine, based on the sensor signal, whether a degradation of a material is present at the one or more interface channels of the plurality of interface channels; and output information indicating whether the degradation of the material is present at the one or more interface channels of the plurality of interface channels.

Clause 2: The system of clause 1, wherein the degradation monitoring circuit further comprises a comparator, wherein the sensor signal indicates an electrical parameter value corresponding to the one or more interface channels, and wherein the degradation monitoring circuit is further configured to: compare, using the comparator, the electrical parameter value to a baseline electrical parameter value; and determine, based on comparing the electrical parameter value to the baseline electrical parameter value, whether the degradation of the material is present at the one or more interface channels.

Clause 3: The system of clause 2, wherein to determine whether the degradation of the material is present at the one or more interface channels, the degradation monitoring circuit is configured to: determine that the degradation of the material is present at the one or more interface channels when the electrical parameter value is more than a threshold parameter amount greater than the baseline electrical parameter value; and determine that the degradation of the material is not present at the one or more interface channels when the electrical parameter value is not more than the threshold parameter amount greater than the baseline electrical parameter value.

Clause 4: The system of any of clauses 1-3, wherein the degradation monitoring circuit is further configured to: in response to determining that the degradation of the material is present at the one or more interface channels, cause the semiconductor device to transition from a normal operation mode to a safe operation mode, wherein a magnitude of a first electrical current that flows across the one or more interface channels from the source terminal to the drain terminal in response to the semiconductor device operating in the normal operation mode is greater than a magnitude of a second electrical current that flows across the one or more interface channels from the source terminal to the drain terminal in response to the semiconductor device operating in the safe operation mode.

Clause 5: The system of clause 4, wherein the one or more interface channels comprise a first set of interface channels, and wherein to cause the semiconductor device to transition from the normal operation mode to the safe operation mode, the degradation monitoring circuit is configured to: cause the first set of interface channels to disconnect so that electrical current flows from the source terminal to the drain terminal via a second set of interface channels of the plurality of interface channels without flowing through the first set of interface channels where the degradation of the material is present, wherein the second set of interface channels is separate from the first set of interface channels.

Clause 6: The system of any of clauses 1-5, wherein the interface layer further comprises: a first portion of semiconductor material; a second portion of the semiconductor material; a first interface channel of the plurality of interface channels connected to the first portion of semiconductor material, wherein the first interface channel comprises a conductor material; and a second interface channel of the plurality of interface channels connected to the second portion of semiconductor material, wherein the first interface channel comprises the conductor material, wherein the electrical sensor is connected to the first portion of semiconductor material and the second portion of the semiconductor material, and wherein the degradation monitoring circuit is configured to use the electrical sensor to generate the sensor signal corresponding to the first interface channel and the second interface channel.

Clause 7: The system of clause 6, wherein the first interface channel of the plurality of interface channels connects the source terminal to the first portion of semiconductor material, wherein the second interface channel of the plurality of interface channels connects the source terminal to the second portion of the semiconductor material, and wherein the degradation monitoring circuit is configured to generate, using the electrical sensor, the sensor signal based on a sensor signal travelling from the first portion of the semiconductor material to the source terminal via the first interface channel, and travelling from the source terminal to the second portion of the semiconductor material via the second interface channel.

Clause 8: The system of any of clauses 6-7, wherein the first interface channel of the plurality of interface channels connects the drain terminal to the first portion of semiconductor material, wherein the second interface channel of the plurality of interface channels connects the drain terminal to the second portion of the semiconductor material, and wherein the degradation monitoring circuit is configured to generate, using the electrical sensor, the sensor signal based on a sensor signal travelling from the first portion of the semiconductor material to the drain terminal via the first interface channel, and travelling from the drain terminal to the second portion of the semiconductor material via the second interface channel.

Clause 9: The system of any of clauses 6-8, wherein the semiconductor material comprises silicon, and wherein the conductor material comprises copper.

Clause 10: The system of any of clauses 6-9, wherein the semiconductor material comprises any one or combination of silicon, gallium arsenide, gallium nitride, germanium, and silicon carbide, and wherein the conductor material includes any one or combination of copper, silver, aluminum, gold, and graphite.

Clause 11: The system of any of clauses 1-10, wherein the sensor signal is one of a plurality of sensor signals, wherein the semiconductor device is configured to perform a plurality of switching cycles, wherein each switching cycle of the plurality of switching cycles including an activation phase where electrical current flows between the source terminal and the drain terminal, wherein each switching cycle of the plurality of switching cycles including a deactivation phase where the source terminal is disconnected from the drain terminal, and wherein the degradation monitoring circuit is configured to: generate, during the deactivation phase of each switching cycle of the plurality of switching cycles using the electrical sensor, a respective sensor signal of the plurality of sensor signals; and determine, based on each sensor signal of the plurality of sensor signals, whether the degradation of the material is present at the one or more interface channels of the plurality of interface channels.

Clause 12: The system of clause 11, wherein the system further comprises a gate driver circuit, wherein the semiconductor device further comprises a gate terminal, and wherein the gate driver circuit is configured to: deliver a control signal to the gate terminal to control the semiconductor device to perform the plurality of switching cycles, wherein electrical current flowing between the source terminal and the drain terminal during the activation phase of each switching cycle of the plurality of switching cycles causes the degradation of the material present at the one or more interface channels.

Clause 13: The system of any of clauses 1-12, wherein the degradation monitoring circuit further comprises a comparator, wherein the electrical sensor represents a first electrical sensor, wherein the sensor signal represents a first sensor signal, wherein the one or more interface channels comprises a first one or more interface channels, and wherein the degradation monitoring circuit is further configured to: generate, using a second electrical sensor, a second sensor signal corresponding to a second one or more interface channels of the plurality of interface channels; compare, using the comparator, the first sensor signal with the second sensor signal; and determine whether the degradation of the material is present at the first one or more interface channels based on comparing the first sensor signal with the second sensor signal.

Clause 14: A degradation monitoring circuit including an electrical sensor, wherein the degradation monitoring circuit is configured to: generate, using the electrical sensor, a sensor signal corresponding to one or more interface channels of a plurality of interface channels of a semiconductor device, wherein the semiconductor device comprises: a source terminal; a drain terminal; and an interface layer between the source terminal and the drain terminal, the interface layer comprising the plurality of interface channels. The degradation monitoring circuit is also configured to determine, based on the sensor signal, whether a degradation of a material is present at the one or more interface channels of the plurality of interface channels; and output information indicating whether the degradation of the material is present at the one or more interface channels of the plurality of interface channels.

Clause 15: The degradation monitoring circuit of clause 14, further comprising a comparator, wherein the sensor signal indicates an electrical parameter value corresponding to the one or more interface channels, and wherein the degradation monitoring circuit is further configured to: compare, using the comparator, the electrical parameter value to a baseline electrical parameter value; and determine, based on comparing the electrical parameter value to the baseline electrical parameter value, whether the degradation of the material is present at the one or more interface channels.

Clause 16: The degradation monitoring circuit of clause 15, wherein to determine whether the degradation of the material is present at the one or more interface channels, the degradation monitoring circuit is configured to: determine that the degradation of the material is present at the one or more interface channels when the electrical parameter value is more than a threshold parameter amount greater than the baseline electrical parameter value; and determine that the degradation of the material is not present at the one or more interface channels when the electrical parameter value is not more than the threshold parameter amount greater than the baseline electrical parameter value.

Clause 17: The degradation monitoring circuit of any of clauses 14-16, wherein the degradation monitoring circuit is further configured to: in response to determining that the degradation of the material is present at the one or more interface channels, cause the semiconductor device to transition from a normal operation mode to a safe operation mode, wherein a magnitude of a first electrical current that flows across the one or more interface channels from the source terminal to the drain terminal in response to the semiconductor device operating in the normal operation mode is greater than a magnitude of a second electrical current that flows across the one or more interface channels from the source terminal to the drain terminal in response to the semiconductor device operating in the safe operation mode.

Clause 18: The degradation monitoring circuit of clause 17, wherein the one or more interface channels comprise a first set of interface channels, and wherein to cause the semiconductor device to transition from the normal operation mode to the safe operation mode, the degradation monitoring circuit is configured to: cause the first set of interface channels to disconnect so that electrical current flows from the source terminal to the drain terminal via a second set of interface channels of the plurality of interface channels without flowing through the first set of interface channels where the degradation of the material is present, wherein the second set of interface channels is separate from the first set of interface channels.

Clause 19: The degradation monitoring circuit of any of clauses 14-18, wherein the electrical sensor is connected to a first portion of semiconductor material of the interface layer and a second portion of the semiconductor material of the interface layer, wherein the interface layer further comprises: the first portion of semiconductor material; the second portion of the semiconductor material; a first interface channel of the plurality of interface channels connected to the first portion of semiconductor material, wherein the first interface channel comprises a conductor material; and a second interface channel of the plurality of interface channels connected to the second portion of semiconductor material, wherein the first interface channel comprises the conductor material, and wherein the degradation monitoring circuit is configured to use the electrical sensor to generate the sensor signal corresponding to the first interface channel and the second interface channel.

Clause 20: The degradation monitoring circuit of clause 19, wherein the first interface channel of the plurality of interface channels connects the source terminal to the first portion of semiconductor material, wherein the second interface channel of the plurality of interface channels connects the source terminal to the second portion of the semiconductor material, and wherein the degradation monitoring circuit is configured to generate, using the electrical sensor, the sensor signal based on a sensor signal travelling from the first portion of the semiconductor material to the source terminal via the first interface channel, and travelling from the source terminal to the second portion of the semiconductor material via the second interface channel.

Clause 21: The degradation monitoring circuit of any of clauses 19-20, wherein the first interface channel of the plurality of interface channels connects the drain terminal to the first portion of semiconductor material, wherein the second interface channel of the plurality of interface channels connects the drain terminal to the second portion of the semiconductor material, and wherein the degradation monitoring circuit is configured to generate, using the electrical sensor, the sensor signal based on a sensor signal travelling from the first portion of the semiconductor material to the drain terminal via the first interface channel, and travelling from the drain terminal to the second portion of the semiconductor material via the second interface channel.

Clause 22: The degradation monitoring circuit of any of clauses 14-21, wherein the sensor signal is one of a plurality of sensor signals, wherein the degradation monitoring circuit is further configured to: generate, during a deactivation phase of each switching cycle of a plurality of switching cycles using the electrical sensor, a sensor signal of a plurality of sensor signals, wherein each switching cycle of the plurality of switching cycles includes an activation phase where electrical current flows between the source terminal of the semiconductor device and the drain terminal of the semiconductor device, wherein each switching cycle of the plurality of switching cycles includes a deactivation phase where the source terminal of the semiconductor device is disconnected from the drain terminal of the semiconductor device; and determine, based on each sensor signal of the plurality of sensor signals, whether the degradation of the material is present at the one or more interface channels of the plurality of interface channels.

Clause 23: The degradation monitoring circuit of any of clauses 14-22, wherein the degradation monitoring circuit further comprises a comparator, wherein the electrical sensor represents a first electrical sensor, wherein the sensor signal represents a first sensor signal, wherein the one or more interface channels comprises a first one or more interface channels, and wherein the degradation monitoring circuit is further configured to: generate, using a second electrical sensor, a second sensor signal corresponding to a second one or more interface channels of the plurality of interface channels; compare, using the comparator, the first sensor signal with the second sensor signal; and determine whether the degradation of the material is present at the first one or more interface channels based on comparing the first sensor signal with the second sensor signal.

Clause 24: A method comprising: generating, by a degradation monitoring circuit using an electrical sensor, a sensor signal corresponding to one or more interface channels of a plurality of interface channels of a semiconductor device, wherein the semiconductor device comprises: a source terminal; a drain terminal; and an interface layer between the source terminal and the drain terminal, the interface layer comprising the plurality of interface channels. The method further comprises determining, by the degradation monitoring circuit based on the sensor signal, whether a degradation of a material is present at the one or more interface channels of the plurality of interface channels; and outputting, by the degradation monitoring circuit, information indicating whether the degradation of the material is present at the one or more interface channels of the plurality of interface channels.

The techniques described in this disclosure may be implemented, at least in part, in hardware, software, firmware or any combination thereof. For example, various aspects of the described techniques may be implemented within one or more processors, including one or more microprocessors, DSPs, ASICs, FPGAs, or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include RAM, ROM, programmable read only memory (PROM), erasable programmable read only memory (EPROM), EEPROM, flash memory, a hard disk, a compact disk-read only memory (CD-ROM), a floppy disk, a cassette, magnetic media, optical media, or other computer readable media.

Various examples have been described. These and other examples are within the scope of the following claims.

What is claimed is:

1. A system comprising:
a semiconductor device comprising:
    a source terminal;
    a drain terminal; and
    an interface layer between the source terminal and the drain terminal, the interface layer comprising a plurality of interface channels; and
a degradation monitoring circuit comprising an electrical sensor, wherein the degradation monitoring circuit is configured to:
    generate, using the electrical sensor, a sensor signal corresponding to one or more interface channels of the plurality of interface channels;
    determine, based on the sensor signal, whether a degradation of a material is present at the one or more interface channels of the plurality of interface channels; and
    output information indicating whether the degradation of the material is present at the one or more interface channels of the plurality of interface channels.

2. The system of claim 1, wherein the degradation monitoring circuit further comprises a comparator, wherein the sensor signal indicates an electrical parameter value corresponding to the one or more interface channels, and wherein the degradation monitoring circuit is further configured to:
    compare, using the comparator, the electrical parameter value to a baseline electrical parameter value; and
    determine, based on comparing the electrical parameter value to the baseline electrical parameter value, whether the degradation of the material is present at the one or more interface channels.

3. The system of claim 2, wherein to determine whether the degradation of the material is present at the one or more interface channels, the degradation monitoring circuit is configured to:
    determine that the degradation of the material is present at the one or more interface channels when the electrical parameter value is more than a threshold parameter amount greater than the baseline electrical parameter value; and
    determine that the degradation of the material is not present at the one or more interface channels when the electrical parameter value is not more than the threshold parameter amount greater than the baseline electrical parameter value.

4. The system of claim 1, wherein the degradation monitoring circuit is further configured to:
    in response to determining that the degradation of the material is present at the one or more interface channels, cause the semiconductor device to transition from a normal operation mode to a safe operation mode,
    wherein a magnitude of a first electrical current that flows across the one or more interface channels from the source terminal to the drain terminal in response to the semiconductor device operating in the normal operation mode is greater than a magnitude of a second electrical current that flows across the one or more interface channels from the source terminal to the drain terminal in response to the semiconductor device operating in the safe operation mode.

5. The system of claim 4, wherein the one or more interface channels comprise a first set of interface channels, and wherein to cause the semiconductor device to transition from the normal operation mode to the safe operation mode, the degradation monitoring circuit is configured to:
    cause the first set of interface channels to disconnect so that electrical current flows from the source terminal to the drain terminal via a second set of interface channels of the plurality of interface channels without flowing through the first set of interface channels where the degradation of the material is present,
    wherein the second set of interface channels is separate from the first set of interface channels.

6. The system of claim 1,
wherein the interface layer further comprises:
    a first portion of semiconductor material;
    a second portion of the semiconductor material;
    a first interface channel of the plurality of interface channels connected to the first portion of semiconductor material, wherein the first interface channel comprises a conductor material; and
    a second interface channel of the plurality of interface channels connected to the second portion of semiconductor material, wherein the first interface channel comprises the conductor material,
wherein the electrical sensor is connected to the first portion of semiconductor material and the second portion of the semiconductor material, and
wherein the degradation monitoring circuit is configured to use the electrical sensor to generate the sensor signal corresponding to the first interface channel and the second interface channel.

7. The system of claim 6,
wherein the first interface channel of the plurality of interface channels connects the source terminal to the first portion of semiconductor material,
wherein the second interface channel of the plurality of interface channels connects the source terminal to the second portion of the semiconductor material, and
wherein the degradation monitoring circuit is configured to generate, using the electrical sensor, the sensor signal based on a sensor signal travelling from the first portion of the semiconductor material to the source terminal via the first interface channel, and travelling from the source terminal to the second portion of the semiconductor material via the second interface channel.

8. The system of claim 6,
wherein the first interface channel of the plurality of interface channels connects the drain terminal to the first portion of semiconductor material,

27 wherein the second interface channel of the plurality of interface channels connects the drain terminal to the second portion of the semiconductor material, and wherein the degradation monitoring circuit is configured to generate, using the electrical sensor, the sensor signal based on a sensor signal travelling from the first portion of the semiconductor material to the drain terminal via the first interface channel, and travelling from the drain terminal to the second portion of the semiconductor material via the second interface channel.

9. The system of claim 6, wherein the semiconductor material comprises silicon, and wherein the conductor material comprises copper.

10. The system of claim 6, wherein the semiconductor material comprises any one or combination of silicon, gallium arsenide, gallium nitride, germanium, and silicon carbide, and wherein the conductor material includes any one or combination of copper, silver, aluminum, gold, and graphite.

11. The system of claim 1, wherein the sensor signal is one of a plurality of sensor signals, wherein the semiconductor device is configured to perform a plurality of switching cycles, wherein each switching cycle of the plurality of switching cycles including an activation phase where electrical current flows between the source terminal and the drain terminal, wherein each switching cycle of the plurality of switching cycles including a deactivation phase where the source terminal is disconnected from the drain terminal, and wherein the degradation monitoring circuit is configured to:

generate, during the deactivation phase of each switching cycle of the plurality of switching cycles using the electrical sensor, a respective sensor signal of the plurality of sensor signals; and determine, based on each sensor signal of the plurality of sensor signals, whether the degradation of the material is present at the one or more interface channels of the plurality of interface channels.

12. The system of claim 11, wherein the system further comprises a gate driver circuit, wherein the semiconductor device further comprises a gate terminal, and wherein the gate driver circuit is configured to:

deliver a control signal to the gate terminal to control the semiconductor device to perform the plurality of switching cycles, wherein electrical current flowing between the source terminal and the drain terminal during the activation phase of each switching cycle of the plurality of switching cycles causes the degradation of the material present at the one or more interface channels.

13. The system of claim 1, wherein the degradation monitoring circuit further comprises a comparator, wherein the electrical sensor represents a first electrical sensor, wherein the sensor signal represents a first sensor signal, wherein the one or more interface channels comprises a first one or more interface channels, and wherein the degradation monitoring circuit is further configured to:

generate, using a second electrical sensor, a second sensor signal corresponding to a second one or more interface channels of the plurality of interface channels;

compare, using the comparator, the first sensor signal with the second sensor signal; and

28 determine whether the degradation of the material is present at the first one or more interface channels based on comparing the first sensor signal with the second sensor signal.

14. A degradation monitoring circuit comprising an electrical sensor, wherein the degradation monitoring circuit is configured to:

generate, using the electrical sensor, a sensor signal corresponding to one or more interface channels of a plurality of interface channels of a semiconductor device, wherein the semiconductor device comprises:

a source terminal;

a drain terminal; and an interface layer between the source terminal and the drain terminal, the interface layer comprising the plurality of interface channels;

determine, based on the sensor signal, whether a degradation of a material is present at the one or more interface channels of the plurality of interface channels; and output information indicating whether the degradation of the material is present at the one or more interface channels of the plurality of interface channels.

15. The degradation monitoring circuit of claim 14, further comprising a comparator, wherein the sensor signal indicates an electrical parameter value corresponding to the one or more interface channels, and wherein the degradation monitoring circuit is further configured to:

compare, using the comparator, the electrical parameter value to a baseline electrical parameter value; and determine, based on comparing the electrical parameter value to the baseline electrical parameter value, whether the degradation of the material is present at the one or more interface channels.

16. The degradation monitoring circuit of claim 15, wherein to determine whether the degradation of the material is present at the one or more interface channels, the degradation monitoring circuit is configured to:

determine that the degradation of the material is present at the one or more interface channels when the electrical parameter value is more than a threshold parameter amount greater than the baseline electrical parameter value; and determine that the degradation of the material is not present at the one or more interface channels when the electrical parameter value is not more than the threshold parameter amount greater than the baseline electrical parameter value.

17. The degradation monitoring circuit of claim 14, wherein the degradation monitoring circuit is further configured to:

in response to determining that the degradation of the material is present at the one or more interface channels, cause the semiconductor device to transition from a normal operation mode to a safe operation mode, wherein a magnitude of a first electrical current that flows across the one or more interface channels from the source terminal to the drain terminal in response to the semiconductor device operating in the normal operation mode is greater than a magnitude of a second electrical current that flows across the one or more interface channels from the source terminal to the drain terminal in response to the semiconductor device operating in the safe operation mode.

18. The degradation monitoring circuit of claim 17, wherein the one or more interface channels comprise a first set of interface channels, and wherein to cause the semiconductor device to transition from the normal operation mode to the safe operation mode, the degradation monitoring circuit is configured to:

cause the first set of interface channels to disconnect so that electrical current flows from the source terminal to the drain terminal via a second set of interface channels of the plurality of interface channels without flowing through the first set of interface channels where the degradation of the material is present, wherein the second set of interface channels is separate from the first set of interface channels.

19. The degradation monitoring circuit of claim 14, wherein the electrical sensor is connected to a first portion of semiconductor material of the interface layer and a second portion of the semiconductor material of the interface layer, wherein the interface layer further comprises:

the first portion of semiconductor material;

the second portion of the semiconductor material;

a first interface channel of the plurality of interface channels connected to the first portion of semiconductor material, wherein the first interface channel comprises a conductor material; and a second interface channel of the plurality of interface channels connected to the second portion of semiconductor material, wherein the first interface channel comprises the conductor material, and wherein the degradation monitoring circuit is configured to use the electrical sensor to generate the sensor signal corresponding to the first interface channel and the second interface channel.

20. The degradation monitoring circuit of claim 19, wherein the first interface channel of the plurality of interface channels connects the source terminal to the first portion of semiconductor material, wherein the second interface channel of the plurality of interface channels connects the source terminal to the second portion of the semiconductor material, and wherein the degradation monitoring circuit is configured to generate, using the electrical sensor, the sensor signal based on a sensor signal travelling from the first portion of the semiconductor material to the source terminal via the first interface channel, and travelling from the source terminal to the second portion of the semiconductor material via the second interface channel.

21. The degradation monitoring circuit of claim 19, wherein the first interface channel of the plurality of interface channels connects the drain terminal to the first portion of semiconductor material, wherein the second interface channel of the plurality of interface channels connects the drain terminal to the second portion of the semiconductor material, and wherein the degradation monitoring circuit is configured to generate, using the electrical sensor, the sensor signal based on a sensor signal travelling from the first portion of the semiconductor material to the drain terminal via the first interface channel, and travelling from the drain terminal to the second portion of the semiconductor material via the second interface channel.

22. The degradation monitoring circuit of claim 14, wherein the sensor signal is one of a plurality of sensor signals, wherein the degradation monitoring circuit is further configured to:

generate, during a deactivation phase of each switching cycle of a plurality of switching cycles using the electrical sensor, a sensor signal of a plurality of sensor signals, wherein each switching cycle of the plurality of switching cycles includes an activation phase where electrical current flows between the source terminal of the semiconductor device and the drain terminal of the semiconductor device, wherein each switching cycle of the plurality of switching cycles includes a deactivation phase where the source terminal of the semiconductor device is disconnected from the drain terminal of the semiconductor device; and determine, based on each sensor signal of the plurality of sensor signals, whether the degradation of the material is present at the one or more interface channels of the plurality of interface channels.

23. The degradation monitoring circuit of claim 14, wherein the degradation monitoring circuit further comprises a comparator, wherein the electrical sensor represents a first electrical sensor, wherein the sensor signal represents a first sensor signal, wherein the one or more interface channels comprises a first one or more interface channels, and wherein the degradation monitoring circuit is further configured to:

generate, using a second electrical sensor, a second sensor signal corresponding to a second one or more interface channels of the plurality of interface channels;

compare, using the comparator, the first sensor signal with the second sensor signal; and determine whether the degradation of the material is present at the first one or more interface channels based on comparing the first sensor signal with the second sensor signal.

24. A method comprising:

generating, by a degradation monitoring circuit using an electrical sensor, a sensor signal corresponding to one or more interface channels of a plurality of interface channels of a semiconductor device, wherein the semiconductor device comprises:

a source terminal;

a drain terminal; and an interface layer between the source terminal and the drain terminal, the interface layer comprising the plurality of interface channels;

determining, by the degradation monitoring circuit based on the sensor signal, whether a degradation of a material is present at the one or more interface channels of the plurality of interface channels; and outputting, by the degradation monitoring circuit, information indicating whether the degradation of the material is present at the one or more interface channels of the plurality of interface channels.

\* \* \* \* \*